United States Patent [19]
Grimaldi et al.

[11] Patent Number: 5,841,167
[45] Date of Patent: Nov. 24, 1998

[54] MOS-TECHNOLOGY POWER DEVICE INTEGRATED STRUCTURE

[75] Inventors: Antonio Grimaldi, Mascalucia; Antonino Schillaci, Messina; Ferruccio Frisina, Sant'Agata Li Battiati; Giuseppe Ferla, Catania, all of Italy

[73] Assignees: SGS-Thomson Microelectronics S.r.l., Agrate Brianza; Consorzio per la Ricerca sulla Microelettronica nel Mezzogiorno, Catania, both of Italy

[21] Appl. No.: 772,657

[22] Filed: Dec. 23, 1996

[30] Foreign Application Priority Data

Dec. 28, 1995 [EP] European Pat. Off. .............. 95830542

[51] Int. Cl.$^6$ ........................... H01L 29/76; H01L 29/94; H01L 31/062; H01L 31/113
[52] U.S. Cl. .......................... 257/341; 257/336; 257/337; 257/339
[58] Field of Search .................................. 157/336, 337, 157/339, 341

[56] References Cited

U.S. PATENT DOCUMENTS

| | | | |
|---|---|---|---|
| 4,015,278 | 3/1977 | Fukuta ....................................... | 357/22 |
| 4,055,884 | 11/1977 | Jambotkar ................................. | 29/571 |
| 4,072,975 | 2/1978 | Ishitani . | |

(List continued on next page.)

FOREIGN PATENT DOCUMENTS

| | | | |
|---|---|---|---|
| A-1 123 119 | 5/1982 | Canada ........................... | H01L 29/04 |
| A 1 136 291 | 11/1982 | Canada ........................... | H01L 29/94 |
| A-0 119 400 | 9/1984 | European Pat. Off. ........ | H01L 29/78 |

(List continued on next page.)

OTHER PUBLICATIONS

Mena J., et al., "High Frequency Performance of VDMOS Power Transistors", International Electron Devices Meeting. Technical Digest, Washington, D.C., USA, 8–10 Dec. 1980. 1980 New York, NY, USA.

Patent Abstracts of Japan, vol. 005, No. 040 (E–049), Mar. 17, 1981 & JP–A–55 163877 (Toshiba Corp.).

(List continued on next page.)

*Primary Examiner*—Naân V. Ngô
*Attorney, Agent, or Firm*—Wolf, Greenfield & Sacks, P.C.

[57] ABSTRACT

A MOS-gated power device integrated structure comprises a plurality of elementary units formed in a semiconductor material layer of a first conductivity type. Each elementary unit is formed in a body stripe of a second conductivity type. There are a plurality of body stripes of the second conductivity type extending substantially in parallel to each other and at least one source region of the first conductivity type disposed within each body stripe. A conductive gate layer is insulatively disposed over the semiconductor material layer between the body stripes in the form of a first web structure. A second web structure of the second conductivity type is formed in the semiconductor material layer and comprises an annular frame portion surrounding the plurality of bodystripes and at least one first elongated stripe extending between two sides of the annular frame portion in a direction substantially orthogonal to the body stripes and that is merged at each end with the annular frame portion. The body stripes are divided by the at least one first elongated stripe into at least two groups of body stripes, wherein one end of each body stripe is merged with the annular frame portion of the second conductivity type and the other end is merged with the at least one first elongated stripe. A conductive gate finger is insulatively disposed above the first elongated stripe and is part of the first web structure. A conductive gate ring surrounds the conductive gate layer and the conductive gate finger and completes the first web structure. A metal gate finger is disposed above the conductive gate finger and is merged at its ends with a metal gate ring structure disposed above the conductive gate ring to provide a third web structure. Source metal plates cover the at least two groups of body stripes and contact each source region and each body stripe to form a source electrode of the power device. A bottom surface of the semiconductor material layer forms a drain of the power device.

47 Claims, 13 Drawing Sheets

U.S. PATENT DOCUMENTS

| | | | |
|---|---|---|---|
| 4,145,700 | 3/1979 | Jambotkar | 357/23 |
| 4,344,081 | 8/1982 | Pao et al. | 357/43 |
| 4,345,265 | 8/1982 | Blanchard | 357/23 |
| 4,376,286 | 3/1983 | Lidow . | |
| 4,399,449 | 8/1983 | Herman et al. | 357/53 |
| 4,412,242 | 10/1983 | Herman et al. | 357/52 |
| 4,414,560 | 11/1983 | Lidow | 357/39 |
| 4,593,302 | 6/1986 | Lidow . | |
| 4,605,948 | 8/1986 | Martinelli | 357/34 |
| 4,642,666 | 2/1987 | Lidow et al. | 357/23.4 |
| 4,680,853 | 7/1987 | Lidow . | |
| 4,705,759 | 11/1987 | Lidow et al. | 437/29 |
| 4,716,126 | 12/1987 | Cogan | 437/24 |
| 4,798,810 | 1/1989 | Blanchard et al. | 437/29 |
| 4,816,882 | 3/1989 | Blanchard et al. | 357/23.4 |
| 4,901,127 | 2/1990 | Chow et al. | 357/23.4 |
| 4,927,772 | 5/1990 | Arthur et al. | 437/6 |
| 4,931,408 | 6/1990 | Hshieh | 437/44 |
| 4,959,699 | 9/1990 | Lidow et al. | 257/328 |
| 4,963,972 | 10/1990 | Shinohe et al. | 357/38 |
| 4,974,059 | 11/1990 | Kinzer | 357/23.4 |
| 5,008,725 | 4/1991 | Lidow . | |
| 5,031,009 | 7/1991 | Fujihira | 357/23.4 |
| 5,119,153 | 6/1992 | Korman et al. | 357/23.4 |
| 5,130,767 | 7/1992 | Lidow et al. | 357/23.4 |
| 5,160,985 | 11/1992 | Akiyama | 257/145 |
| 5,164,804 | 11/1992 | Terashima | 257/487 |
| 5,191,396 | 3/1993 | Lidow et al. | 257/339 |
| 5,208,471 | 5/1993 | Mori et al. | 257/327 |
| 5,286,984 | 2/1994 | Nakagawa et al. | 257/139 |
| 5,338,961 | 8/1994 | Lidow et al. | 257/342 |
| 5,382,538 | 1/1995 | Zambrano . | |
| 5,418,179 | 5/1995 | Hotta | 437/57 |
| 5,426,320 | 6/1995 | Zambrano | 257/328 |
| 5,442,216 | 8/1995 | Gough | 257/355 |
| 5,489,799 | 2/1996 | Zambrano . | |
| 5,563,436 | 10/1996 | Barret et al. | 257/328 |
| 5,621,234 | 4/1997 | Kato | 257/339 |
| 5,631,483 | 5/1997 | Ferla et al. | 257/341 |
| 5,731,604 | 3/1998 | Kinzer | 257/153 |

FOREIGN PATENT DOCUMENTS

| | | | |
|---|---|---|---|
| A-0 211 972 | 3/1987 | European Pat. Off. | H01L 29/78 |
| A-0 237 932 | 9/1987 | European Pat. Off. | H01L 29/60 |
| A-0 252 236 | 1/1988 | European Pat. Off. | H01L 29/78 |
| A-0 279 403 | 8/1988 | European Pat. Off. | H01L 29/78 |
| A-0 304 839 | 3/1989 | European Pat. Off. | H01L 21/28 |
| A-0 358 389 | 3/1990 | European Pat. Off. | H01L 29/06 |
| A-0 393 949 | 10/1990 | European Pat. Off. | H01L 29/78 |
| A-0 405 138 | 1/1991 | European Pat. Off. | H01L 29/72 |
| A-0 543 313 | 5/1993 | European Pat. Off. | H01L 29/78 |
| A-0 632 503 | 1/1995 | European Pat. Off. | H01L 29/06 |
| A-0 671 769 | 9/1995 | European Pat. Off. | H01L 29/78 |
| A-0 685 886 | 12/1995 | European Pat. Off. | H01L 23/48 |
| A-2 640 081 | 6/1990 | France | H01L 27/10 |
| A-51-48981 | 4/1976 | Japan | H01L 29/78 |
| A-51-85381 | 7/1976 | Japan | H01L 29/78 |
| A-51-23088 | 9/1977 | Japan | H01L 29/78 |
| A-52-65943 | 9/1977 | Japan | H01L 29/78 |
| A-53-66181 | 6/1978 | Japan | H01L 29/78 |
| A-53-74385 | 7/1978 | Japan | H01L 29/76 |
| A-53-135284 | 11/1978 | Japan | H01L 29/78 |
| 2 087 648 | 5/1982 | United Kingdom | H01L 23/00 |
| A-94 11904 | 5/1994 | WIPO | H01L 29/78 |

OTHER PUBLICATIONS

Patent Abstracts of Japan, vol. 015, No. 442 (E–1131), Nov. 11, 1991 & JP–A–03 185737 (Toshiba Corp.).

Patent Abstracts of Japan, vol. 011, No. 231 (E–527), Jul. 28, 1987 & JP–A–62 047162 (Matsushita Electric Works Ltd.).

Patent Abstracts of Japan, vol. 014, No. 038 (E–878), Jan. 24, 1990 & JP–A–01 272163 (Fuji Electric Co. Ltd.).

Patent Abstracts of Japan, vol. 017, No. 039 (E–1311), Jan. 25, 1993 & JP–A–04 256367 (Hitachi Ltd.).

Patent Abstracts of Japan, vol. 017, No. 213 (E–1356), Apr. 26, 1993 & JP–A–04 349660 (Toshiba Corp.).

Patent Abstracts of Japan, vol. 008, No. 053 (E–231), Mar. 9, 1984 & JP–A–58 206174 (Tokyo Shibaura Denki KK).

Semiconductor Science and Technology, Apr. 1993, UK, vol. 8, No. 4, oo 488–494, Galvagno G., et al. "Diffusion and Outdiffusion of Aluminum Implanted into Silicon".

Patent Abstracts of Japan vol. 014, No. 387 (E–0967), Aug. 21, 1990 & JP–A–02 143566 (Toshiba Corp.).

Stanford Electronics Laboratories, Integrated Circuits Laboratory, Stanford University, Stanford, CA, Technical Report No. 4956–1, Mar. 1976, Michael Donald Pocha, "High Voltage Double Diffused MOS Transistors for Integrated Circuits" pp. 229–240.

IEEE Journal of Solid–State Circuits, vol. SC–11, No. 4, Aug. 1976, Isao Yoshida, et al., "A High Power MOSFET With A Vertical Drain Electrode And A Meshed Gate Structure", pp. 472–477.

Siliconix Technical Proposal in response to N.A.F.I., Solicitation #N00163–77–R–1197, Aug. 31, 1977, Labor And Materials to Design, Develop and Fabricate a 500V/2A N–Channel Metal Oxide Semiconductor F.E.T.

IEEE Transactions On Electron Devices, vol. ED–27, No. 2, Feb. 1980, S.C. Sun, et al., "Modeling Of The On–Resistance Of LDMOS, VDMOS, and VMOS Power Transistors", pp. 356–367.

International Electron Devices Meeting–Tech. Digest, Dec. 8–10, 1980, Washington, D.C., pp. 91–94, J. Mena, et al., "High Frequency Performance Of VDMOS Power Transistors".

Solid State Electronics, vol. 27, No. 5, pp. 419–432, 1984, P. McGregor, et al, "Small–Signal High–Frequency Performance Of Power MOS Transistors".

IEEE Transactions on Electron Devices, vol. ED–31, No. 1, Jan. 1984, pp 109–113, Jose G. Mena, et al., "Breakdown Voltage Design Considerations in VDMOS Structures".

Soild State Electronics, vol. 29, No. 6, pp. 647–656, 1986, Jose G. Mena, et al., "High–Voltage Multiple–Resistivity Drift–Region LDMOS".

Solid State Electronics, 1977, vol. 29, pp. 875–878, Surinder Krishna, "Second Breakdown In High Voltage MOS Transistors".

Electronic Design, For Engineers and Engineering Managers–Worldwide, pp. 8276–8282, "HEXFET, A New Power Technology Cuts On–Resistance, Boosts Ratings".

ICs and Semiconductors, pp. 8272–8275.

Laid Open Patent Specification No. 85073/80, Laid Open Date: June 26, 1980, Patent Number 75/162,677, Kanushiki Kaisha Hitachi Seisakusho, "Methods For Manufacturing Insulated Gate Type Field Effect Transistors".

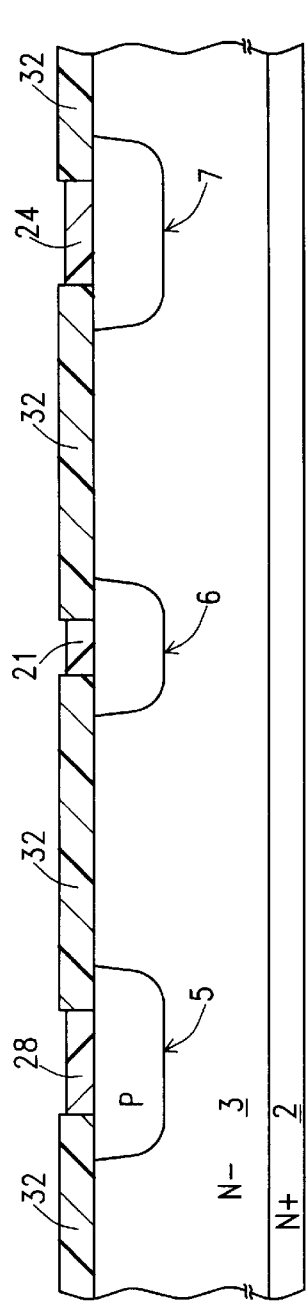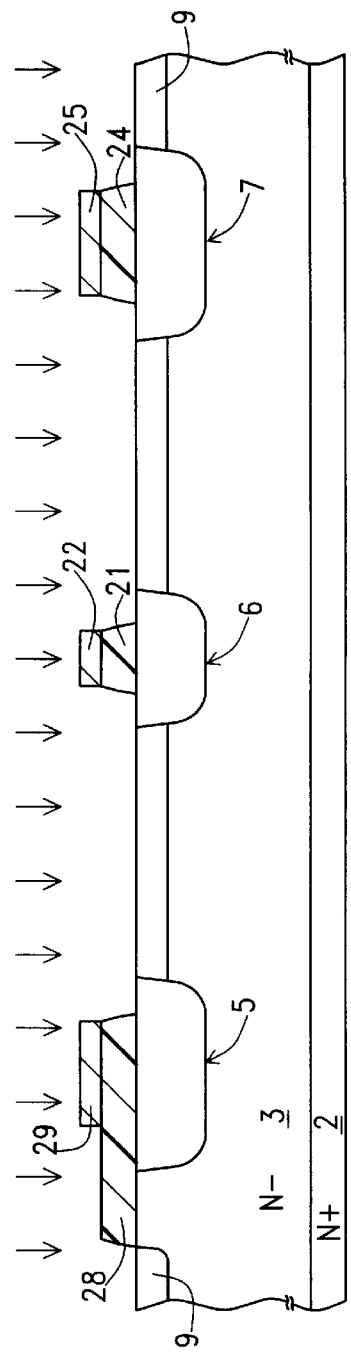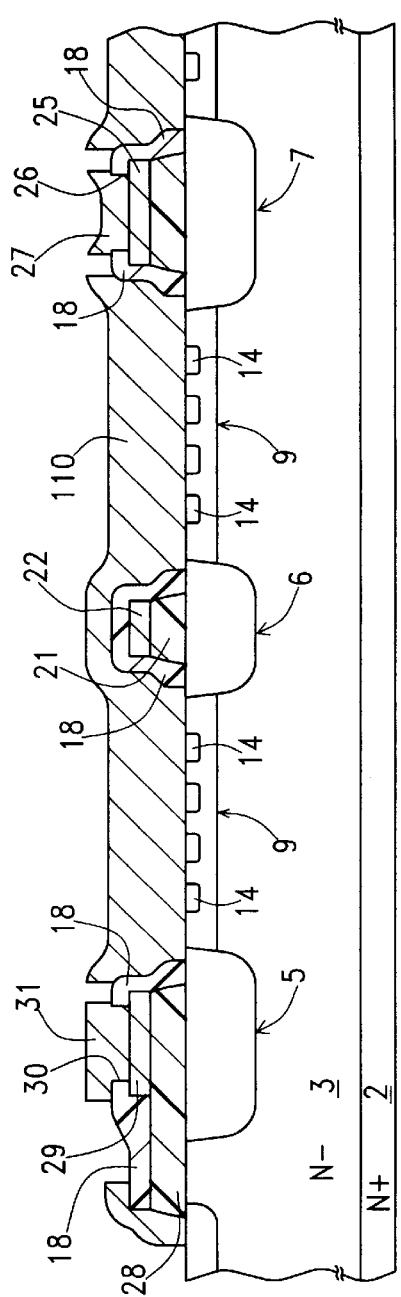

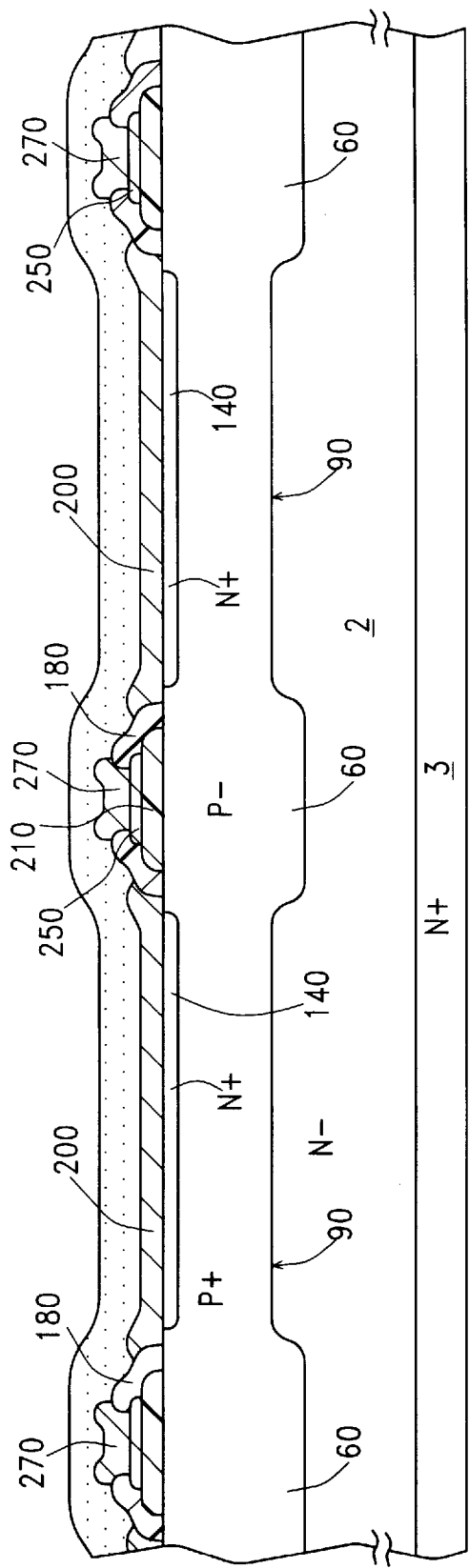
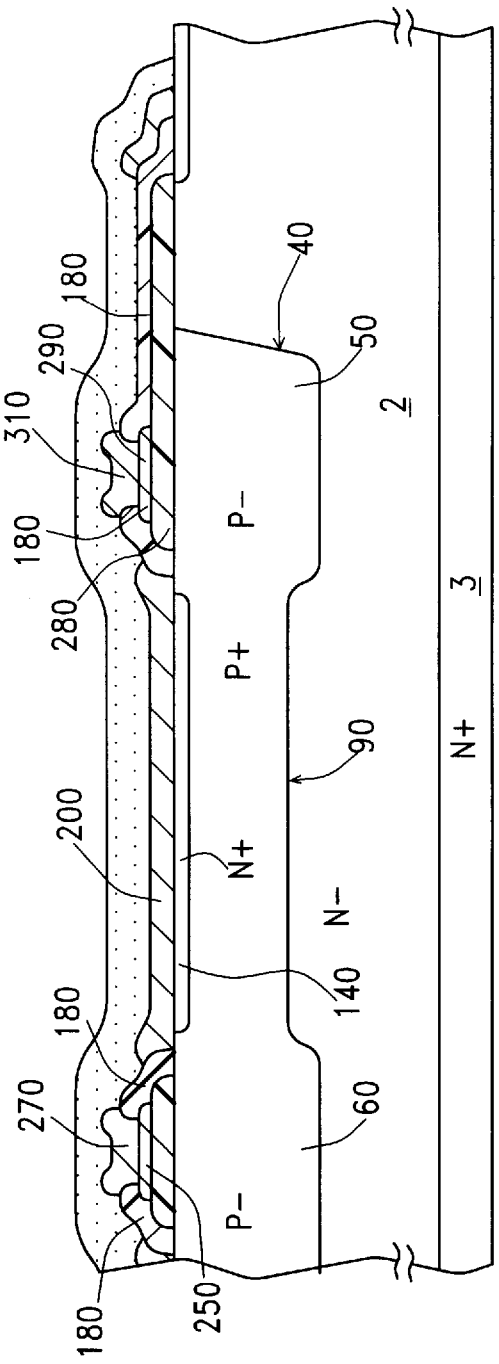

MOS-TECHNOLOGY POWER DEVICE INTEGRATED STRUCTURE

Background Of The Invention

1. Field of the Invention

The present invention relates to either discrete devices or integrated power semiconductor devices including MOS-gated power devices such as, for example, power MOSFETs, IGBTs, MOS-gated thyristors or other MOS-gated power devices. In particular, the invention relates to a MOS-gated power device having an improved gate resistance, an improved dynamic performance, and a higher frequency of operation.

2. Discussion of the Related Art

MOS-technology power devices are used for applications wherein high currents at high voltages are to be switched on and off in times on the order of hundreds of nanoseconds. There is therefore a need for MOS-technology devices capable of handling high power levels in short time periods. Thus, there is a need for MOS-technology power devices with suitable dynamic performance capability.

In addition, it is desirable to achieve large channel widths per unit area, and thus MOS-technology power devices are typically made up of a large number of elementary cells that are connected in parallel to form an array of elementary cells. This arrangement desirably yields a resistance for the channel region of the power device in an on-state (Ron) that can be relatively low.

U.S. Pat. No. 4,593,302 (Lidow et al) discloses a high power MOSFET including a plurality of elementary cells formed from a plurality of polygonal regions (base regions) in a semiconductor material layer, which have a square or hexagonal shape. Each polygonal region is surrounded by a narrow conduction region of enhanced conductivity $N^+$ that is disposed beneath a gate oxide layer. Each of the polygonal regions includes an opposite conductivity ring region (source region) respectively. The ring regions together with the polygonal regions and the conductive region define channel regions of the high power MOSFET device. The gate oxide layer includes polygonal shaped openings immediately above the polygonal regions which expose the source rings. A polysilicon gate electrode made up of a polysilicon layer is disposed over the gate oxide layer. A silicon dioxide layer is deposited atop the polysilicon layer and insulates the polysilicon gate electrode from a source electrode, which is subsequently deposited over an entire upper surface of the semiconductor wafer. A drain electrode is disposed at a bottom surface of the semiconductor wafer. In addition, a boundary region is disposed in the semiconductor material layer and surrounds the array of elementary cells in order to provide an edge structure that increases a breakdown voltage of the high power MOSFET.

Thus, Lidow et al discloses a plurality of base regions that are spaced from one another and that in a preferred embodiment are hexagonal in shape. In addition, Lidow et al discloses that the plurality of the spaced base regions are spaced from each other by a body of semiconductor material which is the drain region of the high power MOSFET and is a continuous mesh. Further, Lidow et al discloses that the conductive channel regions are defined by the outer periphery of the source regions and the periphery of the spaced base regions. In particular, Lidow et al discloses that the channel region around the periphery of the spaced base regions results in a carrier flow path that is outward from the source regions toward an adjacent base region and downward into the common drain region.

The dynamic performance of cellular MOS-technology power device according to the related art is however limited by a presence of parasitic capacitances and by a gate resistance of the device. These problems are exacerbated by interruptions in the array of elementary cells, which are provided for essentially three reasons. First, in order to reduce the gate resistance of the power device, metal gate fingers are provided over an outer surface of an area containing a plurality of the polygonal regions and the metal gate fingers make contact to the polysilicon gate layer in order to keep the polysilicon gate layer at substantially a same potential. Second, the metal gate fingers are interrupted in regions of the chip where a source electrode is provided and in an area where a source bond pad is provided for bonding to the source electrode. Third, the metal gate fingers are interrupted in regions of the chip where a gate bond pad is provided. These interruptions introduce asymmetries within the power MOSFET device resulting in points of low breakdown or undesirable performance in of the power device. In particular, the metal gate fingers interrupting the array of elementary cells result in the structure having a non-uniform distance between adjacent polygonal regions across the active area of the power device chip. Also, since a total number of the metal gate fingers contacting the polysilicon gate layer is limited, the distributed gate resistance can be very non-uniform. For example, the elementary cells near the metal gate fingers experience a significantly lower gate resistance than those further away from the metal gate fingers.

In view of the related art described, it is an object of the present invention to provide an improved MOS-technology power device integrated structure.

SUMMARY OF THE INVENTION

It is an object of the present invention to provide a MOS-gated power device having a reduced gate resistance, an improved dynamic performance, and a higher frequency of operation.

According to the present invention, a MOS-gated power device structure includes a plurality of elementary units formed in a semiconductor material layer of a first conductivity type. Each elementary unit is formed in a body portion of a second conductivity type formed in the semiconductor material layer, and includes at least one source region of the first conductivity type formed in the body portion. In addition, each elementary unit includes a conductive gate layer disposed above a surface of the semiconductor material layer between and over a lateral portion of the body portion and over a lateral edge of the at least one source region. The lateral portion of the body portion between the lateral edge of the at least one source region and a lateral edge of the body portion forms a channel region. Further, the MOS-gated power device includes a first web structure of the second conductivity formed in the semiconductor material layer. The first web structure includes a frame portion of the second conductivity type disposed in the semiconductor material layer surrounding the plurality of body portions, a first portion of the second conductivity type disposed in the semiconductor material layer and extending in a direction substantially orthogonal to the plurality of body portions, and the plurality of body portions. The first portion is merged with the frame portion at each end of the first portion. Moreover, an insulating layer covers the semiconductor material layer and has windows therein to expose the plurality of source regions and a source metal plate covers the insulating layer and contacts the at least one source region.

With this arrangement, a MOS-gated power device is provided that does not have a cellular structure. More specifically, the polygonal elementary cells of the related art have been replaced by the web structure of the present invention. In addition with this arrangement, the elements of the web structure including the frame portion, the first portion, and the plurality of body portions are electrically connected to each other to provide a highly uniform and constant gate voltage across the MOS-gated power device. With this arrangement the plurality of body portions forming each elementary unit of the MOS-gated power device are at a same electric potential.

In an embodiment of the present invention, the MOS-gated power device includes a first conductive gate layer insulatively disposed above the first portion and a metal gate layer disposed above and connected to the first conductive gate layer through a window in the insulating layer. The first conductive gate layer is connected to a conductive frame layer insulatively disposed above the frame portion to provide a second web structure that also includes the conductive gate layer within each elementary unit, wherein each conductive gate layer is connected to the conductive frame layer and to the first conductive gate layer. With this arrangement, the second web structure provides a reduced, substantially uniform, gate resistance of the MOS-gated power device.

In an embodiment of the present invention, the MOS-gated power device includes a third web structure including a metal frame layer disposed above and connected to the conductive frame layer and the metal gate layer which is connected at each end to the metal frame layer. In a preferred embodiment, the metal gate layer and the metal frame layer are each disposed above an oxide layer that respectively covers the first conductive gate layer and the conductive frame layer and that has a window therein to respectively expose the first conductive gate layer and the conductive frame layer, and wherein the metal gate layer and the metal frame layer contact the first conductive gate layer and the conductive frame layer through the window and extend over the oxide layer to form a dual-level metal gate layer and a dual-level metal frame layer. With this arrangement, the gate-to-drain ($C_{GD}$) and the gate-to-source ($C_{GS}$) capacitance of the MOS-gated device are reduced.

In one embodiment of the MOS-gated power device, the at least one source region within each body portion includes two source regions disposed in parallel within each body portion. In an alternative embodiment, the at least one source region includes a plurality of source regions intercalated along a length of each body portion with portions of each body portion. With these arrangements, a transverse dimension of the MOS-gated power device can be reduced and a density of the MOS-gated power device can be increased. In addition, with these arrangements, an output resistance of the MOS-gated device in an on condition ($R_{ON}$) is reduced. Further, a dynamic performance of the MOS-gated device is improved.

In one embodiment of the MOS-gated power device, the conductive gate layer within each elementary unit includes a first conductive gate region and a second conductive gate region disposed substantially in parallel over the semiconductor material layer between the plurality of body portions to form a split conductive gate layer. With this arrangement, the gate-to-drain capacitance ($C_{GS}$) of the MOS-gated power device is reduced and a frequency of operation of the MOS-gated power device is increased.

In one embodiment of the MOS-gated power device, a second body portion of the second conductivity type is located under each conductive gate layer, in parallel with and between the plurality of body portions. With this arrangement, the gate-to-drain (feedback) capacitance of the power device is transformed into the gate-to-source (input) capacitance. In addition, an alternative of this embodiment includes a plurality of regions of the first conductivity type formed in the semiconductor material layer between a respective body portion and a respective second body portion. With this arrangement, the output resistance of the MOS-gated power device in an on condition ($R_{ON}$) is reduced.

In one embodiment of the MOS-gated power device, the input capacitance of the power device is reduced by an oxide layer between the first conductive gate layer and the first portion to isolate the first conductive gate layer from the underlying first portion of the second conductivity type.

According to another embodiment of the present invention a power MOSFET structure includes a lightly doped semiconductor material layer of a first conductivity type and a web structure of a second conductivity type formed in a surface of the semiconductor material layer. The web structure includes the plurality of body portions of the second conductivity type in the semiconductor material layer, and at least one first portion of the second conductivity type in the semiconductor material layer extending in a direction substantially orthogonal to the plurality of body portions. In addition, the web structure includes a frame portion of the second conductivity type in the semiconductor material layer that surrounds the plurality of body portions and the at least one first portion. The at least one first portion is merged with the frame portion at each end of the at least one first portion. Some of the plurality of body portions have an end that is merged with the frame portion and some of the plurality of body portions have an end that is merged with the at least one first portion.

Other objects and features of the present invention will become apparent from the following detailed description when taken in connection with the following drawings. It is to be understood that the drawings are for the purpose of illustration only and are not intended as a definition of the limits of the invention.

BRIEF DESCRIPTION OF THE DRAWINGS

The foregoing and other objects and advantages will be more fully appreciated from the following drawing in which:

FIGS. 8 to 11 illustrate a cross-sectional view of the MOS-gated power device at various steps of a process of manufacturing the MOS-gated power device integrated structure shown in FIG. 1;

FIG. 16 is a cross-sectional view of the MOS-gated power device taken along line XVI—XVI in FIG. 14; and FIG. 17 is a cross-sectional view of the MOS-gated power device taken along line XVII—XVII in FIG. 14.

DETAILED DESCRIPTION

Figure 1:
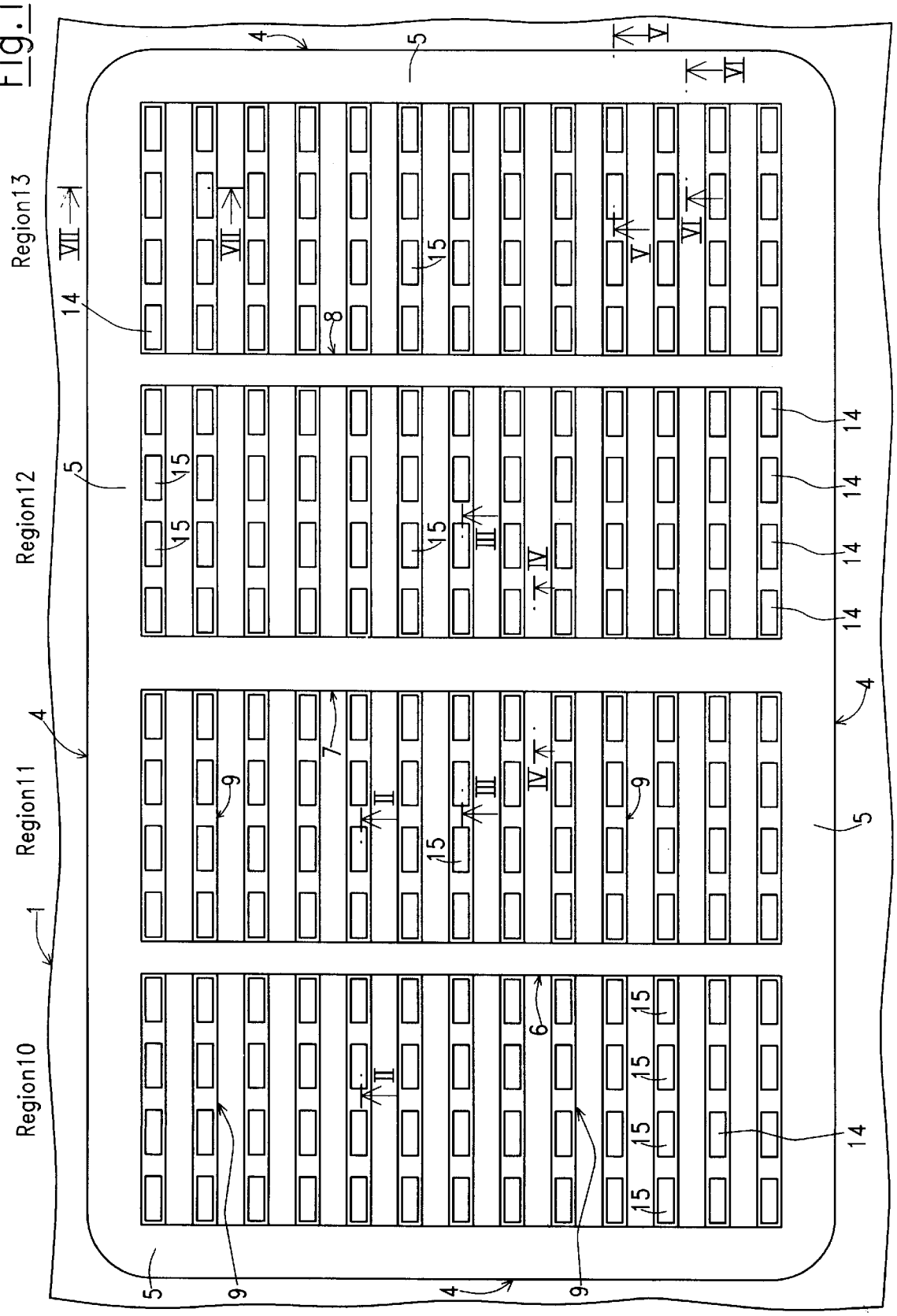
FIG. 1 is a top plan view of a MOS-gated power device integrated structure according to a first embodiment of the present invention.

FIG. 1 is a top-plan view of a MOS-gated power device integrated structure according to a first embodiment of the present invention. FIGS. 2–7 illustrate various cross-sectional views of the MOS-gated power device of FIG. 1 taken along lines II—II, III—III, IV—IV, V—V, VI—VI and VII—VII, respectively. It is to be appreciated that a MOS-gated power device of the present invention can be, for example, a MOSFET, an IGBT, a MOS-gated thyristor, or any other MOS-gated power device.

As illustrated in FIGS. 2 to 7, a semiconductor chip 1 comprises a heavily doped $N^+$ semiconductor substrate 2, over which is disposed a lightly doped $N^-$ semiconductor layer 3. The $N^+$ semiconductor substrate forms a common drain layer of the MOS-technology power device.

Referring to FIGS. 1–6, in the $N^-$ layer 3 a P-type web structure 4 is formed. The P-type web structure 4 comprises a P-type annular frame portion 5, which although illustrated as substantially rectangular can be any shaped annular frame portion. For example, the corners of the annular frame portion can be rounded, as illustrated, or can be squared off at right angles. In addition, the web structure includes P-type elongated stripes 6, 7, 8 formed in the $N^-$ layer 3 that extend substantially parallel to each other within the P type frame and that are merged at their longitudinal ends with the P-type frame 5. As illustrated in FIG. 1, the P-type elongated stripe 7 is preferably wider than the P-type elongated stripes 6 and 8, for reasons that will be explained below. However, it is to be appreciated that alterations of this embodiment, such as for example P-type elongated stripes 6, 7, and 8 having a same width, are intended to be within the scope of his specification.

In addition, the web structure includes a plurality of P-type body stripes 9 formed in the $N^-$ layer 3 that extend substantially parallel to each other and substantially orthogonal to the P-type elongated stripes 6–8. The plurality of body stripes have each end connected between the P-type frame 5 and one of the P-type elongated stripes 6, 8, or between a respective two of the P-type elongated stripes 6, 7, 8. For example, the P-type body stripes 9 in a first Region 10 (See FIG. 1) of device are merged at one longitudinal end with the P-type frame 5 and at second longitudinal end with the P-type elongated stripe 6. In other words, the P-type elongated stripes 6, 7, 8 divide the $N^-$ layer 3 circumscribed by the P-type frame 5 into four Regions 10, 11, 12 and 13, (See FIG. 1) and each one of the Regions 10–13 includes a plurality of substantially parallel P-type body stripes 9 formed in the $N^-$ layer 3. In Regions 10 and 13, the P-type body stripes 9 extend orthogonally between and are merged at one end with the P-type frame 5 and at the other end with the P-type elongated stripes 6 and 8, respectively. In Regions 11 and 12, the P-type body stripes 9 extend orthogonally between and are merged at their ends with the P-type elongated stripe 7 and the P-type elongated stripes 6 and 8, respectively. Also, a first one and a second one of the plurality of P-type body stripes 9 in each one of the Regions 10–13 are merged at a lateral edge of the P-type body stripes with the P-type frame 5, for substantially an entire length of the P-type body stripes. It is to be appreciated that although the P-type body stripes 9 and the P-type elongated stripes 6, 7, and 8 are illustrated as substantially rectangular, they can be an polygonal shape and that such modification is intended to be within the scope of this invention.

The P-type body stripes 9 are a basis of elementary units of the MOS-gated power device according to the present invention, and contribute to an overall current handling capability of the MOS-gated power device. Inside each P-type body stripe 9, at least one heavily doped $N^+$ source region 14 is formed. In the illustrated embodiment of FIGS. 1–7, the $N^+$ source regions 14 are substantially rectangular regions extending along the longitudinal direction of the P-type body stripes 9 and are intercalated with portions of the P-type body stripe 9 where the $N^+$ source regions are absent. However it is to be appreciated that the $N^+$ source regions can have any polygonal shape and that such modification is intended to be within the scope of this invention. It is also to be appreciated that although a plurality of $N^+$ source regions 14 are shown intercalated with the P-type body stripe 9, various alterations and modifications are intended and are within the scope of this disclosure. For example, the source region 14 may be a single substantially rectangular region within the P-type body stripe 9 extending along substantially an entire length of the P-type body stripe 9. Alternatively, the source region 14 may comprise two substantially rectangular regions disposed substantially in parallel and running for substantially the entire length of the P-type body stripe 9. Further, the source regions in each body stripe 9 can be aligned, as illustrated in FIG. 1, or shifted in the longitudinal direction of the body stripes with respect to source regions in adjacent body stripes, or shifted in the longitudinal direction such that the source regions have a same length and are aligned with the body portions of adjacent body stripes.

An advantage of having the source regions intercalated along the length of the body stripes is that the size of each elementary unit is scaled down because the distance between each elementary unit is decreased thereby resulting in an increased density of the elementary units per area of the MOS-gated power device. The reduction in distance between the elementary units of the MOS-gated power device has the added advantage of lowering the gate-to-source capacitance (the input capacitance) and the gate-to-drain capacitance (the feedback capacitance) of the MOS-gated power device, thereby resulting in an improvement in the dynamic performance of the MOS-gated power device. In addition, an advantage of the reduction and distance between the elementary units is that the output resistance of the power device in the "on" condition ($R_{ON}$) is reduced as the size of the elementary units are decreased.

The $N^+$ source regions 14 define channel regions 15 within the P-type body stripes 9. More specifically referring to FIG. 7, an outside edge of each source region 14 and an inside edge of each body stripe define the channel region 15 disposed in the lateral portion of the body stripes along the longitudinal dimension. A conductive insulated gate layer, as discussed in detail below, is disposed over the channel regions to bias the MOS-gated power device of the present invention.

Figure 4:
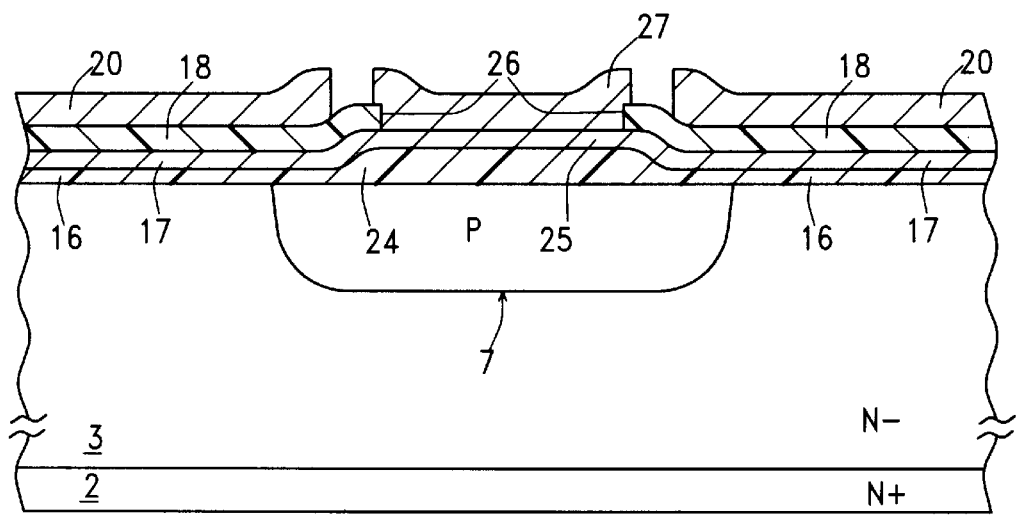
FIG. 4 is a cross-sectional view of the MOS-gated power device taken along line IV—IV in FIG. 1.
Figure 6:
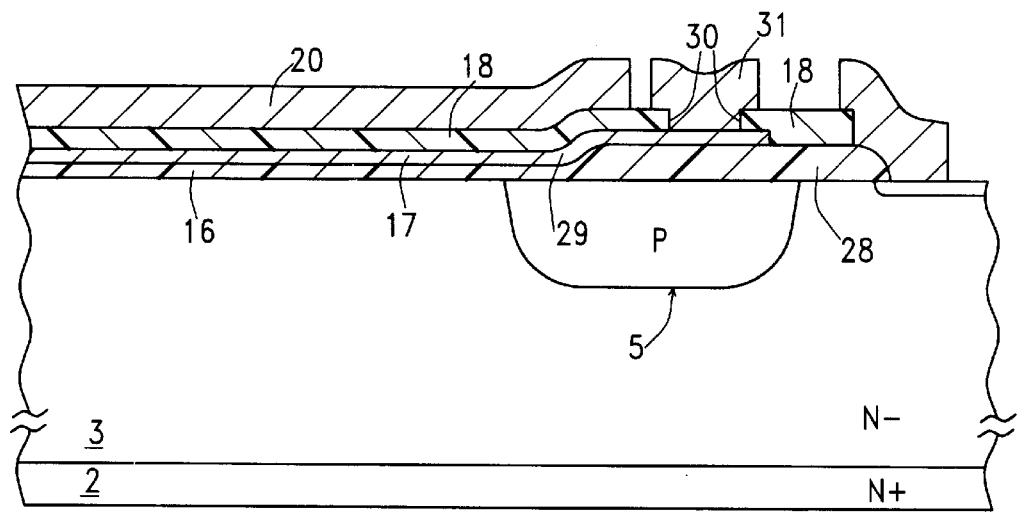
FIG. 6 is a cross-sectional view of the MOS-gated power device taken along line VI—VI in FIG. 1.
Figure 7:
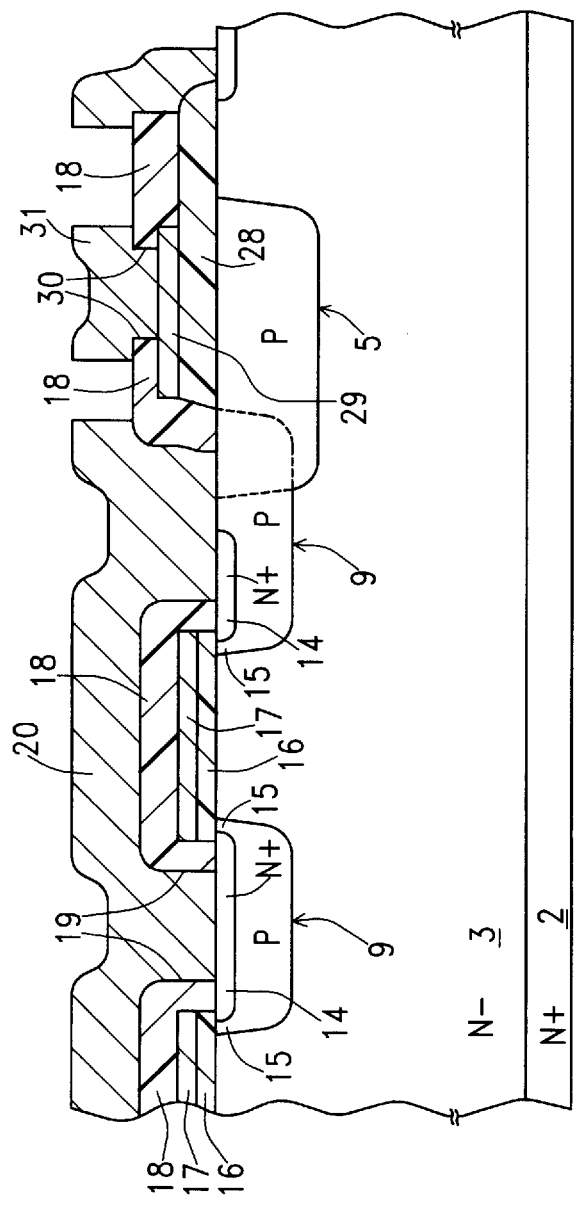
FIG. 7 is a cross-sectional view of the MOS-gated power device taken along line VII—VII in FIG. 1.

As visible in the cross-sectional views of FIGS. 4, 6 and 7, a conductive insulated gate layer includes a thin gate oxide layer 16 disposed over the semiconductor material between respective body stripes 9, extending over the channel regions 15 within the lateral edge of the body stripes 9, and extending over a lateral edge of the respective N+ source regions in the body stripes 9. The conductive insulated gate layer also includes a polysilicon layer 17 that is disposed over the thin gate oxide layer 16. As illustrated in FIG. 7, the conductive insulated gate layer including the gate oxide layer 16 and the polysilicon layer 17, extends over the lateral edge of the P-type body stripes 9 and slightly extends over the lateral edge of the N+ source regions to cover the channel regions 15 within the P-type body stripe 9. The channel regions extend along the longitudinal dimension of the P-type body stripes. The polysilicon layer 17 forms a gate electrode of the MOS-technology power device and when a proper bias voltage is applied to the polysilicon layer 17, an inversion channel is formed in the channel regions 15 of the P-type body stripes 9.

Referring to FIG. 7, the polysilicon layer 17 is covered by a dielectric layer 18 in which elongated contact openings 19 are provided over the P-type body stripes 9. The elongated contact openings 19 extend for substantially the longitudinal length of the P-type body stripes 9 (See FIG. 1). A source metal layer 20 is disposed above the dielectric layer 18 and contacts, through the elongated contact openings 19, the N+ source regions 14 and where the N+ source regions 14 are absent, the P-type body stripes 9. Each one of the Regions 10–13 (See FIG. 1) of the N− layer 3 is covered by a respective continuous source metal plate formed by the source metal layer 20. It is to be appreciated that each of the source metal plates disposed above the Regions 10, 11, 12 and 13 (See FIG. 1) can be a source metal pad for bonding to the source of the MOS power device of the present invention.

Figure 7A:
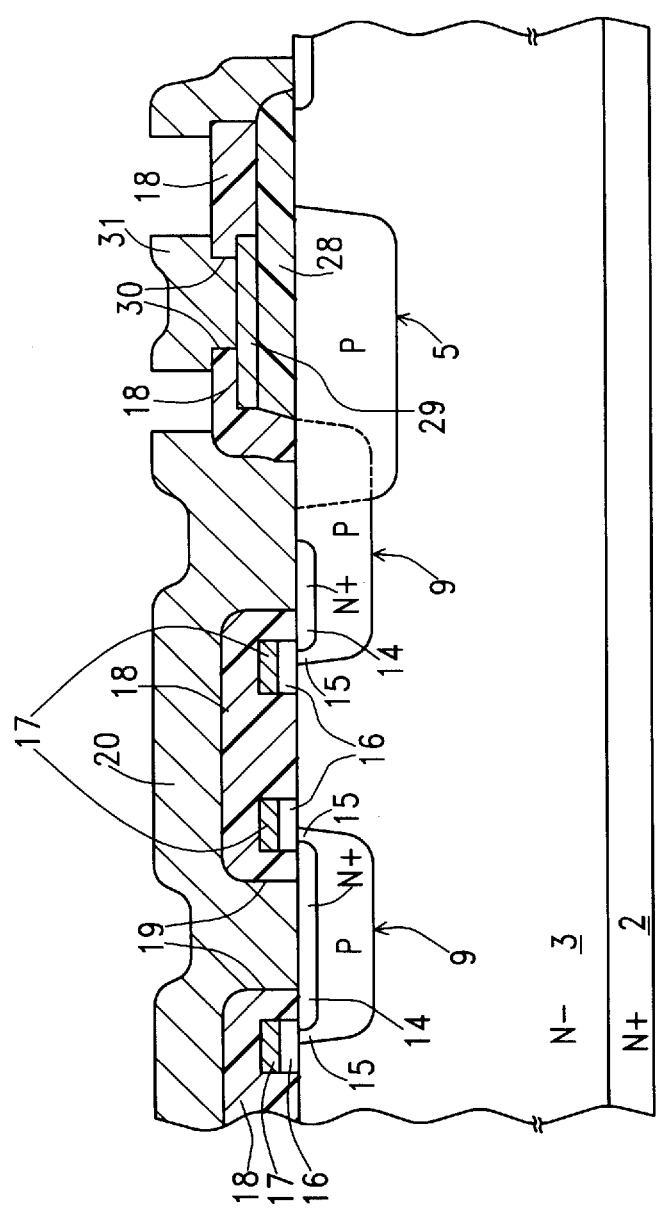
FIG. 7A is a cross-sectional view of the MOS-gated power device along line VII—VII of FIG. 1, illustrating a variation of the invention.

It is to be appreciated that although one embodiment of the conductive insulated gate layer is disclosed, various alterations or modifications can be made and are intended to be within the scope of the present invention. For example, FIG. 7A illustrates a variation of the cross-sectional view taken along line VII—VII of FIG. 1, in which the conductive insulated gate layer comprises a split gate structure. More specifically, the conductive insulated gate layer is divided into two substantially parallel stripes extending in the longitudinal direction of the P-type body stripes. The two parallel stripes include a stripe of a thin oxide layer 16 disposed over an area of the substrate 3 between the respective P-type body stripes 9, disposed over the respective channel region 15, and disposed over the lateral edge of the respective source region 14. In addition, each parallel stripe includes a polysilicon gate layer 17 disposed above the thin oxide layer. It is further to be appreciated that although FIG. 7A illustrates a split gate layer having a thin oxide layer 16 disposed beneath the polysilicon layer 17, a variation of this embodiment is that the split gate layer may have no thin oxide layer 16 disposed beneath the layer of the substantially parallel polysilicon stripes 17 that are over the drain region. An advantage of having no thin oxide layer 16 beneath the layer of the substantially parallel polysilicon stripes 17 is that the gate-to-drain capacitance of the MOS-gated apparatus is reduced and a higher frequency of operation of the MOS-gated power device is possible. Still another alternative is that the thin oxide layer is replaced with a thick oxide layer below the substantially parallel polysilicon stripes 17, so as to reduce the gate-to-drain capacitance.

Figure 7B:
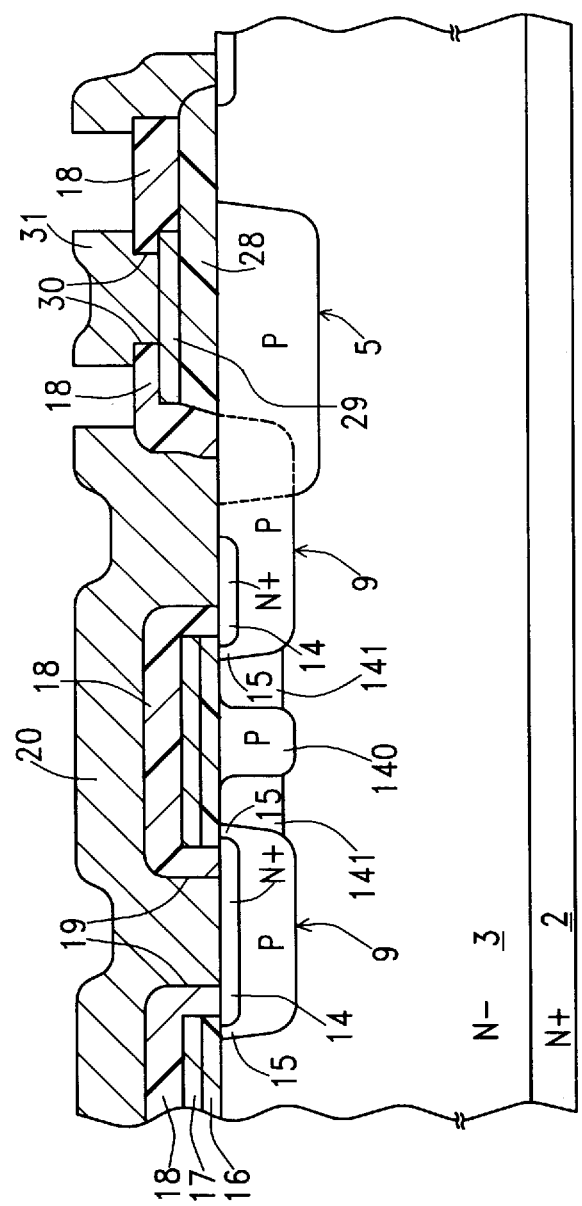
FIG. 7B is a cross-sectional view of the MOS-gated power device along line VII—VII of FIG. 1, illustrating an additional variation of the present invention.

Referring to FIG. 7B, there is illustrated an additional variation of the MOS-gated power 30 device of the present invention which comprises a second plurality of P-type body stripes 140 disposed substantially in parallel and between the P-type body stripes 9. In addition, a plurality of N-type stripes 141 are disposed between each of the P-type body stripes 9 and the second P-type body stripes 140. The second plurality of P-type body stripes are merged at one longitudinal end with the annular frame portion 5 and at the other longitudinal end with one of the P-type elongated stripes 6, 8 or merged at both ends with a respective two of the P-type elongated stripes 6, 7, 8. Each P-type stripe 140 is disposed under a respective conductive insulated gate layer between adjacent P-type body stripes 9. An advantage of this embodiment of the present invention is that the N-type stripes 141 yield a reduced output resistance of the power device in an "on" condition ($R_{ON}$). In addition, the additional P-type body stripe provides two advantages. First, the P-type body stripe provides an improvement in the dynamic performance of the power device because the P-type body stripe is at a same potential as the source of the MOS-gated power device. Thus, a parasitic capacitance associated with the conductive insulated gate layer is converted from a gate-to-drain (feedback) capacitance to an input capacitance between the gate and source. In contrast, when the P-type stripe 140 is absent, the parasitic capacitance between the conductive insulated gate layer and the substrate 3 is the gate-drain capacitance which has a more negative affect on the dynamic performance of the MOS-gated power device than does the capacitance between the gate and source. Second, the P-type stripe 140 provides flattened electric field lines in the semiconductor layer 3 between the body stripes 9 when the MOS-gated power device is reversed-biased with a high reverse voltage applied between the source and the drain. Thus, the P-type body stripe 140 also prevents crowding of the electric field lines in the semiconductor layer 3, which prevents early breakdown of the MOS-gated power device at edges of the P-type body stripes 9 and increases the breakdown voltage of the MOS-gated power device.

Figure 2:
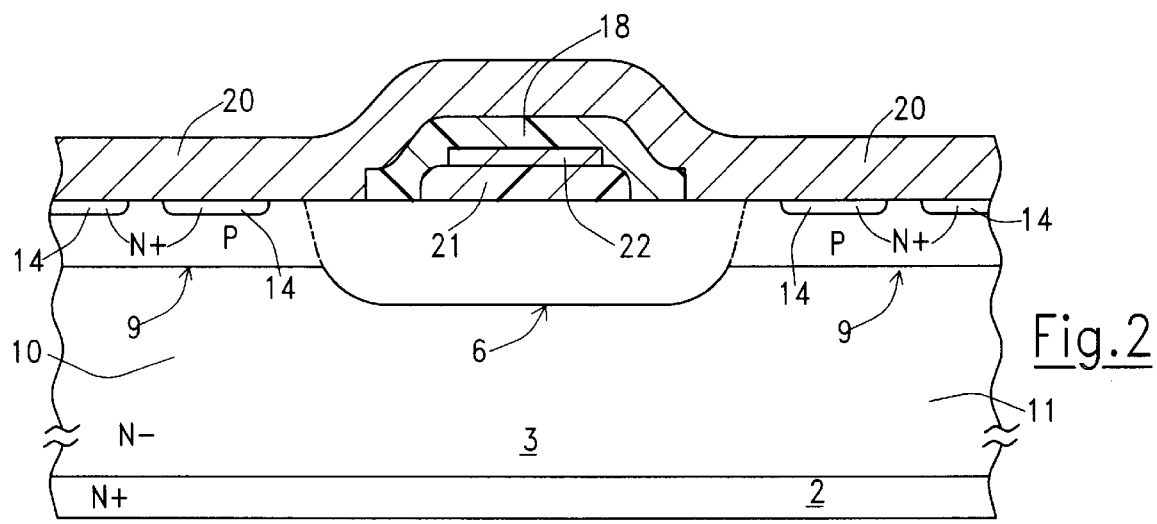
FIG. 2 is a cross-sectional view of the MOS-gated power device taken along line II—II in FIG. 1.

FIG. 2 illustrates in cross-section, a view of the chip taken along line II—II of FIG. 1, where the P-type body stripes 9 are merged with the P-type elongated stripe 6. Disposed over the P-type elongated stripe 6 is a thick oxide layer 21 having a thickness in a range of approximately two to three times a thickness of the gate oxide layer 16. The thick oxide layer 21 extends for substantially the whole longitudinal length of the P-type stripe 6. Disposed over the thick oxide layer 21 is a layer of polysilicon thereby forming a polysilicon gate finger 22. The layer of polysilicon is connected at its lateral edge to the polysilicon layer 17 above the plurality of body stripes 9 thereby forming a conductive metal web structure in the polysilicon layer. The polysilicon gate finger 22 is covered by a dielectric layer 18. The source metal plate covering the Region 10 of the N− layer 3 extends over the dielectric layer 18 which covers the polysilicon gate finger 22 and forms a continuous source metal plate covering the adjacent Region 11 of the N− layer 3. It is to be appreciated that the same arrangement is provided where the P-type body stripes 9 are merged with the P-type elongated stripe 8, or in other words at a junction between Regions 12 and 13 of the chip 1 (See FIG.1). It is also to be appreciated that the stripe of dielectric layer 18 covering the polysilicon gate finger 22 is narrower than the P-type elongated stripes 6, 8 so that the source metal layer 20 can contact the P-type elongated stripes 6, 8 along each stripe's lateral edges. It is further to be appreciated that although the source metal plate is illustrated as one continuous metal plate covering Regions 10–11 and 12–13, the source metal plates covering each of Regions 10, 11, 12 and 13 can be individual source metal plates which are connected together, for example, by bond wires and which results in less source metal being used.

Figure 2A:
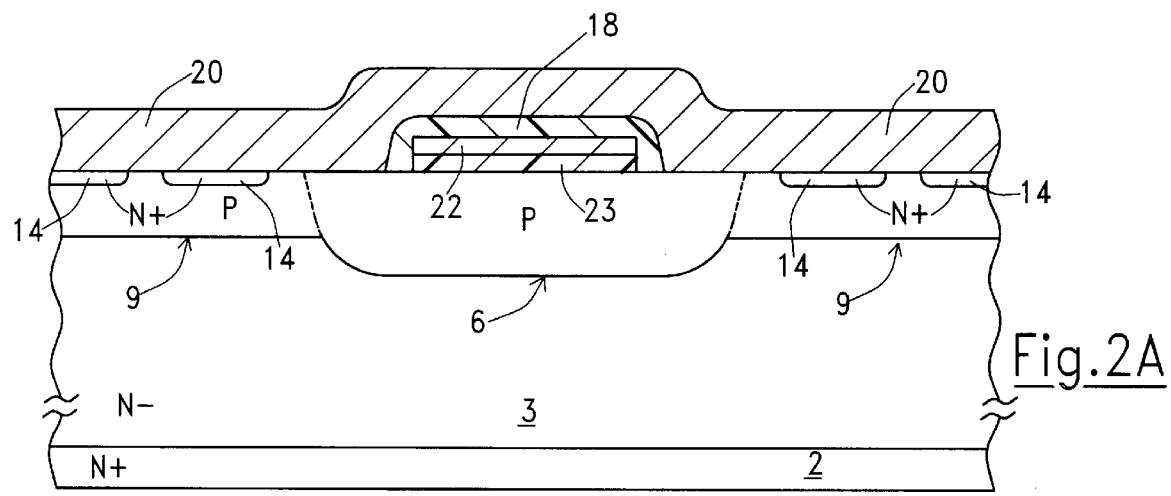
FIG. 2A is a cross-section view of the MOS-gated power device taken along line II—II of FIG. 1, illustrating a variation of the invention.

FIG. 2A illustrates a variation of the embodiment of FIG. 2 wherein the thick oxide stripe 21 has been replaced with a thin gate oxide layer 23 having substantially a same thickness as the gate oxide layer 16 (See FIG. 7). This embodiment, is simpler from a manufacturing viewpoint. However, this embodiment is disadvantageous with respect to the embodiment of FIG. 2 because the thinner gate oxide layer, which isolates the polysilicon gate finger 22 from the underlying P-type elongated stripe 6, results in an increased input (gate-to-source) capacitance of the power device.

Figure 3:
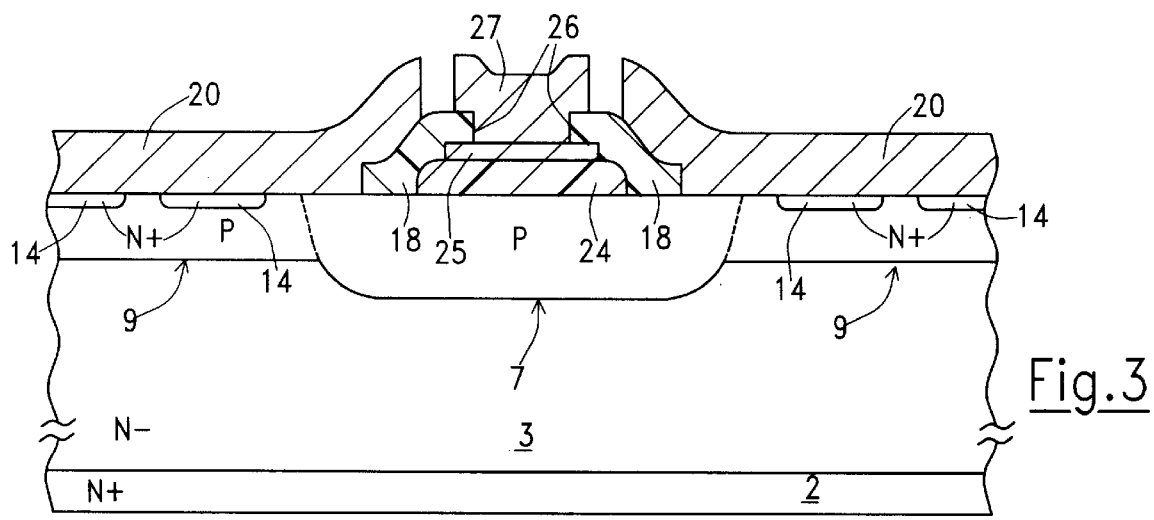
FIG. 3 is a cross-sectional view of the MOS-gated power device taken along line III—III in FIG. 1.

FIG. 3 and 4 respectively illustrate in cross-section of the chip taken along lines III—III and IV—IV of FIG. 1, where the P-type body stripes 9 merge with the P-type elongated stripe 7. Disposed over the P-type elongated stripe 7 is a thick oxide stripe 24 that extends for substantially the whole length of the stripe 7. It is to be appreciated that similar to the above-mentioned variation illustrated in FIG. 2A, the stripe 24 can also be a thin gate oxide layer having a thickness substantially the same as the gate oxide layer 16. Disposed over the thick oxide stripe 24 is a polysilicon gate finger 25. The polysilicon gate finger 25 is formed in the polysilicon gate layer 17 (FIG. 4) and thus is also part of the polysilicon layer web structure. The polysilicon gate finger 25 is covered at its lateral edges by a stripe of the dielectric layer 18. An elongated contact opening 26 is provided in the dielectric layer 18 along the longitudinal length of stripe 7 and is provided over the polysilicon gate finger 25. The source metal plates 20 covering the Regions 11 and 12 of the N⁻ layer 3 are interrupted by the elongated contact opening 26 in the dielectric layer 18, and an elongated dual-level metal gate finger 27 having its lateral edges extending over the dielectric layer 18 contacts the polysilicon gate finger 25 through the elongated contact opening 26. An advantage of the dual-level metal gate finger of the present invention is that the respective capacitances between the gate-to-source ($C_{GS}$) and between the gate-to-drain ($C_{GD}$) are reduced to provide an improve dynamic performance and a higher frequency of operation.

It is to be appreciated that the dielectric layer 18 above the thick oxide layer 24 and over the lateral edge of the polysilicon layer 24, is narrower than the P-type elongated stripe 7 such that the source metal plate 20 contacts the P-type elongated stripe 7 along the lateral sides thereof. Preferably, the P-type elongated stripe 7 is wider than the P-type elongated stripes 6 and 8, since only the polysilicon gate finger 22 is defined over the stripes 6 and 8, whereas the polysilicon gate finger 25, the contact opening 26 in the dielectric layer 18 and the gate metal finger 27 between the two source metal plates 20 are all provided over the stripe 7. However, it is to be appreciated that various alterations and modifications to the structure can be provided and are intended to be within the scope of the present invention. For example, the width of the P-type elongated stripe 7 can be the same as the width of the elongated stripes 6 and 8 and a polysilicon gate finger can be provided above each of the P-type stripe 6, 7, 8.

Pigs. 5 and 6 respectively show in cross-section along lines V—V and VI—IV of FIG. 1 (in a direction parallel to the P-type body stripes 9) a region of the chip 1 where the P-type body stripes 9 merge with the P-type frame 5. The P-type frame 5 is covered by a thick field oxide layer 28, over which a polysilicon gate ring 29 is provided. The polysilicon gate ring 29 is disposed over the P-type frame 5 around the periphery of the P-type body stripes 9 and around the P-type elongated stripes 6, 7, 8 and is part of the web structure in the polysilicon gate layer 17 (FIG. 6). The polysilicon gate fingers 22 and 25 disposed above the P-type elongated stripes, are connected at their ends with the polysilicon gate ring 29. Thus, the polysilicon gate ring 29, the polysilicon gate fingers 22, 25 (see FIGS. 2 and 3) and the polysilicon gate layer 17 (see FIG. 6) form the polysilicon web structure overlying the P-type web 4 in the semiconductor layer. It is to be appreciated, as discussed above, that the thick field oxide layer 28 can also be a thin gate oxide layer having a thickness substantially the same as the gate oxide layer 16.

The dielectric layer 18 which covers the polysilicon gate layer 17 also extends over the polysilicon gate ring 29 to form a dielectric ring covering the polysilicon gate ring 29. A contact opening 30 is provided in the dielectric ring over the polysilicon gate ring 29, and a dual-level metal gate ring 31 is disposed over the dielectric ring along its lateral edges and also contacts the underlying polysilicon gate ring 29 through the contact opening. The dual-level metal gate finger 27 disposed above the elongated P-type stripe 7 is merged at its ends with the dual-level metal gate ring 31 to form a gate metal web structure. It is to be appreciated that a gate metal pad (not illustrated) can be provided anywhere along a periphery of the chip of the present invention and, for example, connected to an inside edge of the dual-level gate metal ring.

It is also to be appreciated that with the structure of the present invention, all of the P-type stripes that make up the P-type web structure 4 in the semiconductor substrate, including all the P-type body stripes 9, the P-type frame 5, and the P-type elongated stripes 6, 7, 8, can be biased at the same electric potential. In addition, an advantage of the P-type elongated stripes 6, 7 and 8 is that they break up the P-type stripes 9 so that it is not necessary to provide elongated P-type body stripes 9 across an entire width of the chip. Further, the polysilicon layer web structure including the conductive gate fingers 22 and 25 extending over the P-type elongated stripes 6, 8 and 7 respectively, the polysilicon layer 17 above the body stripes 9, and the polysilicon ring 29 above the frame portion 5, allow a better distribution of the gate driving signal. Moreover, the metal gate finger 27 extending over the P-type elongated stripe 7 and the metal gate ring 31 disposed above the conductive gate ring form the gate metal web structure that also allows a better distribution of the gate driving signal. An advantage of the web structures of the present invention is that the gate resistance of the MOS-gated power device is greatly reduced.

Still another advantage of the P-type elongated stripes 6, 7, 8 under the polysilicon gate fingers 22 and under the metal gate finger 27, is that the arrangement transforms the gate-drain parasitic capacitance (the output capacitance) of the MOS-technology power device into the gatesource capacitance (the input capacitance), and provides an improvement in the dynamic performance of the power device chip. In addition, the P-type elongated stripes 6, 7 and 8 also form barriers for the electric field provided from the drain region 2 to the gate oxide layer when the junction diodes formed between the body stripes and the common drain layer are switched from a forward to a reverse bias. Thus, the P-type elongated stripes provide an improved dynamic performance and an increased breakdown voltage of the power device.

Figure 8:
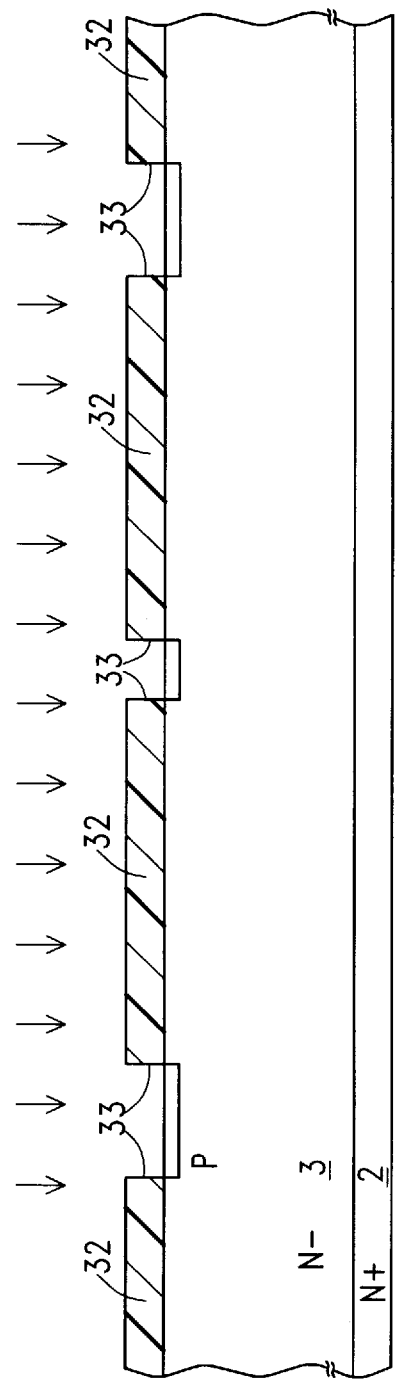

Referring now to FIGS. 8–11, a plurality of steps of a process for manufacturing the MOS-gated power device structure will now be described. Referring to FIG. 8, after the N⁻ semiconductor layer 3 is formed over the N+ substrate 2, for example by an epitaxial growth, a field oxide layer 32 is formed over an entire surface of the N⁻ layer 3. The field oxide layer 32 is then selectively removed from the surface of the N⁻ layer 3 by means of any known photo lithographic process, to open a plurality of windows 33. A P-type dopant, for example boron or aluminum, is then selectively implanted into the N⁻ layer 3 through the windows 33 in the field oxide layer 32 to form the P-type elongated stripes 6, 7, 8 and the frame 5. The use of aluminum is preferred when it is desired that the P-type frame 5 and the P-type elongated stripes 6, 7, 8 extend deeply into the N⁻ layer 3.

Figure 12:
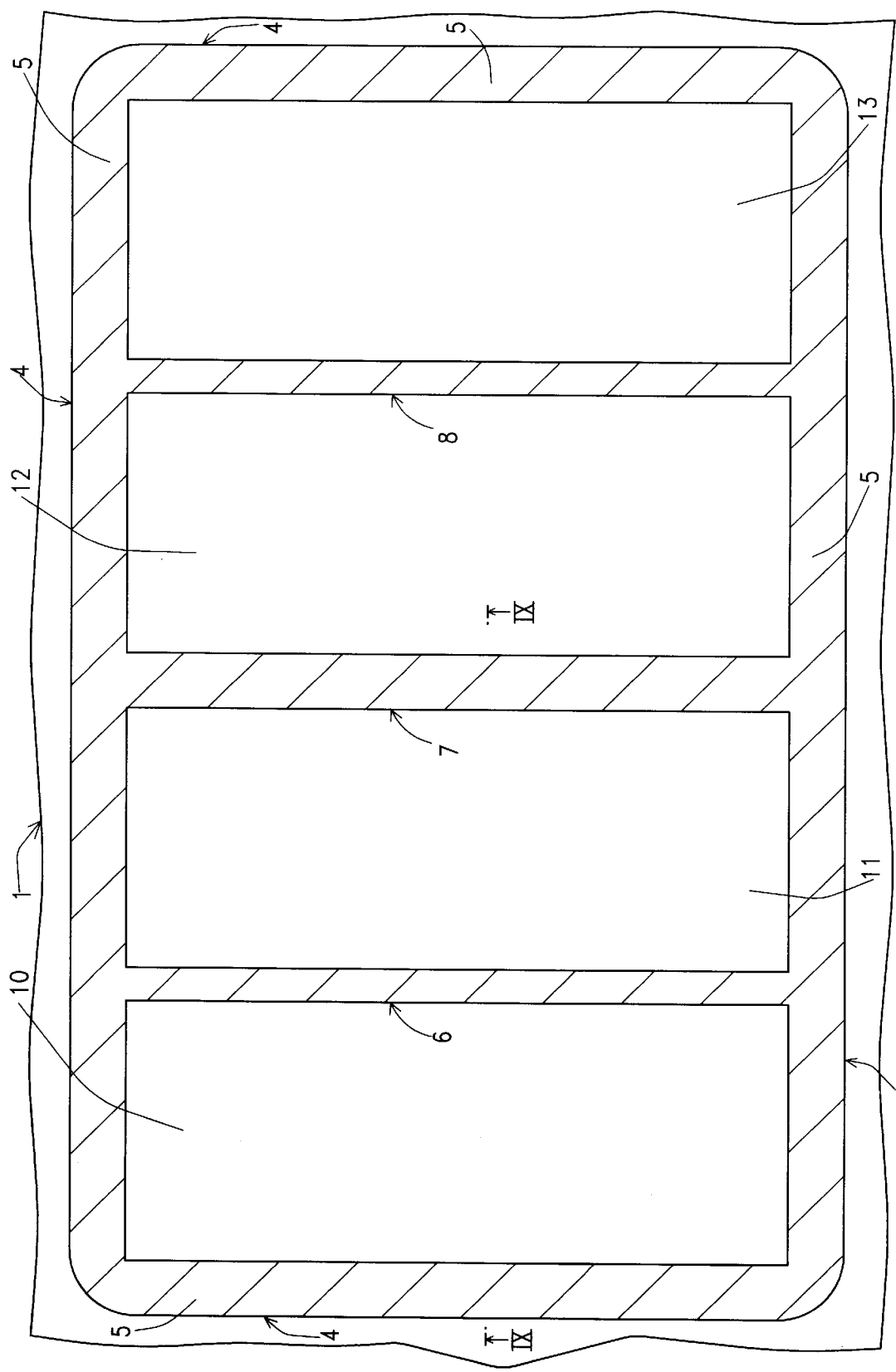
FIG. 12 is a top-plan view of the MOS-gated power device integrated structure after the step shown in FIG. 9.

Referring to FIG. 9, a thermal oxidation process is then performed to grow over the uncovered surface areas of the N⁻ layer 3 (windows 33) an oxide layer 21, 24, 28 with a thickness equal to two to three times the thickness of the gate oxide layer 17 (to be formed in a later step). During the growth of the thick oxide layer 21, 24, 28, the P-type dopant implanted during the previous step diffuses into the N⁻ layer 3 to yield the bowl-like shape for the P-type frame 5 and the P-type elongated stripes 6, 7 and 8. FIG. 12 illustrates a top-plan view of the MOS-gated power device after the steps illustrated in FIG. 9 have been performed. It is to be appreciated that although the P-type stripes 6, 7, 8 are illustrated as having a bowl-like structure various alterations or modifications of the shape of these stripes can be made and are intended to be within the scope of this invention.

Figure 13:
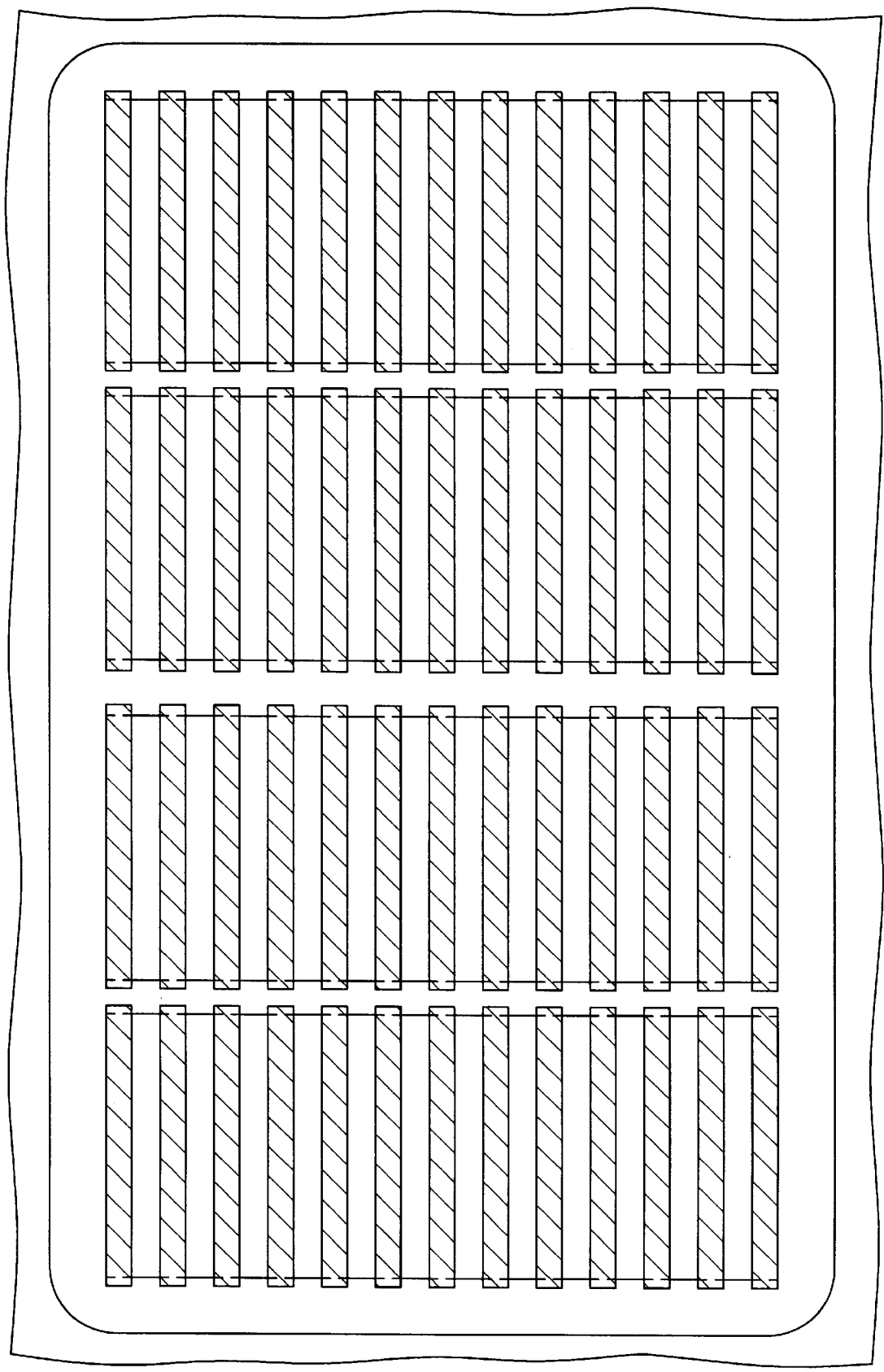
FIG. 13 is a top-plan view of the MOS-gated power device integrated structure after the step shown in FIG. 10.

The remaining field oxide layer 32 is then completely eliminated from the active regions of the chip, where the elementary functional units of the power device are to be formed, in particular in the area surrounded by the P-type frame 5 (step not illustrated). A thin oxide layer 16 is then formed on the surface of the chip where the thick oxide layer 28, 21, 24 is not present (step not illustrated). The thin oxide layer forms the gate oxide layer under the polysilicon gate layer 17 (FIG.7) of the MOS-gated power device and is two to three times thinner than the thick oxide layer. The polysilicon gate layer is then deposited over the whole surface of the power device (step not illustrated). Referring to FIG. 10, the gate oxide layer 16 and the polysilicon gate layer 17 are then selectively removed to define the polysilicon gate fingers 22, 25 and the oxide layer 21, 24 disposed above the P-type elongated stripes 6, 8 and 7 respectively, and the oxide layer 28 and the polysilicon gate ring 29 disposed above the annular frame portion 5, and to open elongated windows over the N⁻ layer 3. As will be explained in detail below, selective introduction of P-type dopants into the N⁻ layer is done to form the body stripes 9 of various shapes. FIG. 13 illustrates a top-plan view of the MOS-gated power device after the steps illustrated in FIG. 10.

Figure 5:
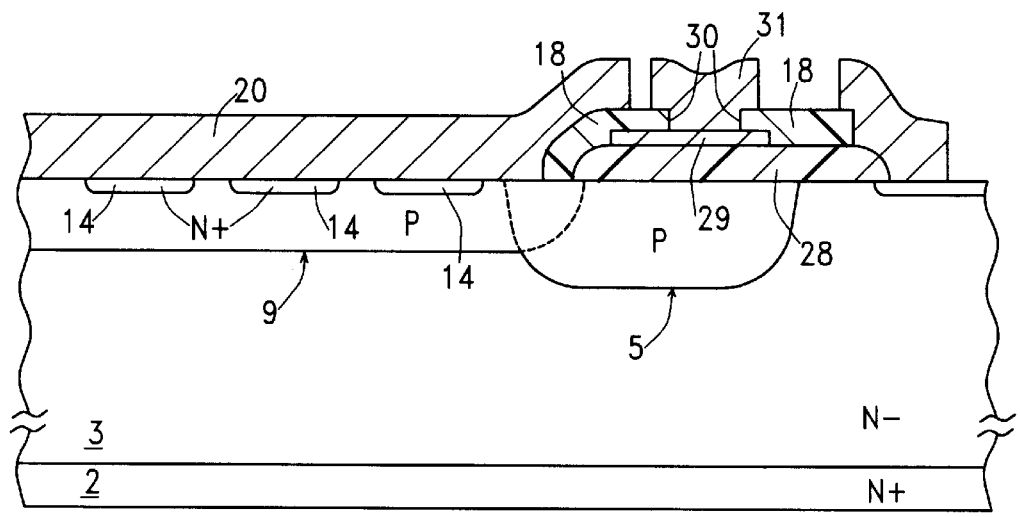
FIG. 5 is a cross-sectional view of the MOS-gated power device taken along line V—V in FIG. 1.

Referring now to FIGS. 10–11, the P-type dopant is implanted into the N⁻ layer 3 through the elongated windows in the polysilicon and gate oxide layers to form the P-type body stripes 9. An N-type dopant is then selectively introduced into the P-type body stripes 9 to form the source regions 14. A dielectric layer 18 is then formed over the entire surface of the chip, and it is selectively removed to open contact openings 26, 30 in the dielectric layer above the elongated polysilicon finger 25 and above the gate ring 29 (FIGS. 3, 5). A metal layer 110 is formed over the dielectric layer 18, as illustrated in FIG. 11, and the metal layer 110 is selectively etched to define the source metal plates 20, the gate metal finger 27 and the gate metal ring 31 (See FIGS. 1–7).

Figure 7C:
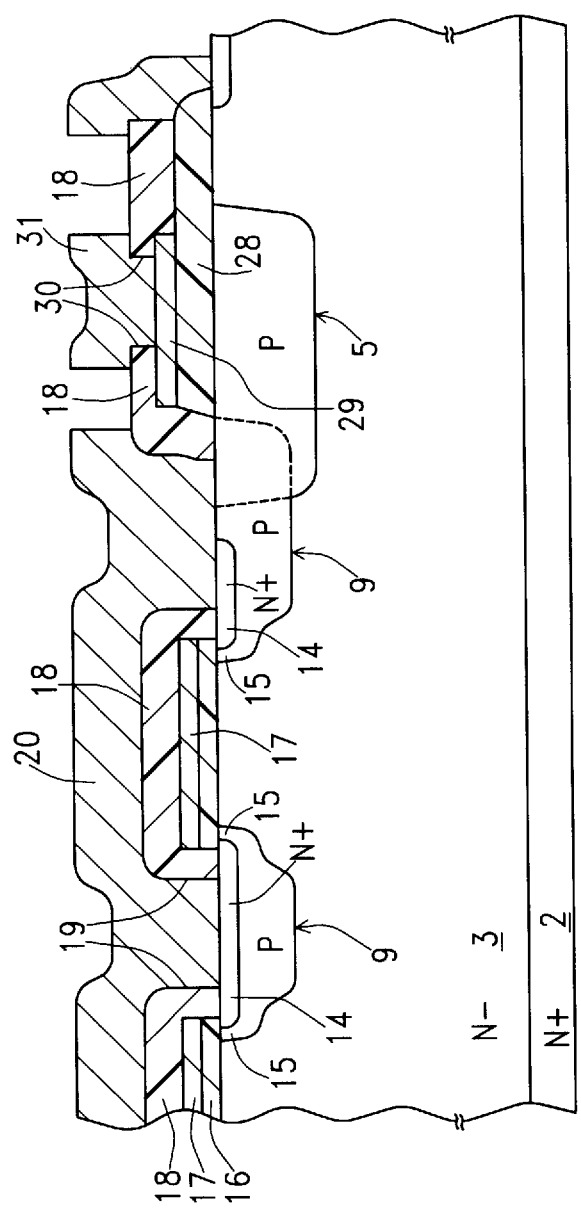
FIG. 7C is a cross-sectional view of the MOS-gated power device along line VII—VII of FIG. 1, illustrating an alternate embodiment of the body portions of the present invention.

It is to be appreciated that although the P-type body stripes 9 are illustrated as having a bowl-like structure various alterations or modifications of the shape of the body stripes can be made and are intended to be within the scope of this invention. For example, the body stripes 9 can be provided with a highly doped deep body portion substantially within a center of the elongated body stripes and with lateral shelf portions of a lower doping profile at lateral edges of the elongated body stripes to form a structure such as disclosed in FIG. 7C. In particular, FIG. 7C illustrates an embodiment of the MOS-technology power device of the present invention wherein the P-type body stripes 9 have the deep body portion and the lateral shelf portions.

According to one embodiment of a manufacturing process of forming the bowl-like P-type body stripes of the present invention, a high dose of a P-type dopant is implanted at a high energy into the epitaxial layer 3 through the elongated openings in the conductive insulated gate layer. For this implantation step the underlying polysilicon layer 17 acts as an implant mask for the dopant ions. For example, boron ions can be implanted in a dose of $10^{14}$–$10^{15}$ atoms/cm$^2$ at an energy of 100–300 keV. With the high implantation energy, deep body portions of the P-type body stripes are formed in the epitaxial layer such that a distribution of the implanted ions has a peak concentration located at a prescribed distance from the surface of the epitaxial layer. An actual value of the prescribed distance depends upon the implantation energy, and preferably the implantation energy is such as to locate the peak concentration of dopants the prescribed distance into the epitaxial layer that is deeper than the source regions. In addition, because the polysilicon layer 17 is used as the mask to form the P-type body stripes, elongated edges of the deep body portion are aligned with elongated edges of the elongated windows in the polysilicon layer.

The implanted ions are then made to diffuse laterally and deeper into the epitaxial layer by a thermal process to form the body stripes 9. The thermal process has a temperature and time duration chosen in such a way that the body stripes have the central heavily doped deep body portion which is formed by a vertical diffusion of dopants into the epitaxial layer having the elongated edges substantially aligned with the elongated edges of the elongated windows, and lateral lightly doped channel regions laterally extending under the gate oxide layer 16 which are formed by lateral diffusion of the dopants into the epitaxial layer. A suitable thermal process can be for example at a temperature of 1050°–1100° C. for 0.5 to 2 hours.

As an alternative, the bowl-like P-type body stripes 9 can be formed by two distinct implants of the P-type dopant into the epitaxial layer 3, in different doses and at different energies, again using the polysilicon layer 17 as an implantation mask for both of the implants. For example, a first implant can involve a dose of a dopant in a range from $10^{13}$–$10^{14}$ atoms/cm$^2$ with an energy of approximately 80 keV to provide a dopant concentration at the surface of the body stripes, or in other words in the channel regions. A second implant can then be for example a dose of a dopant in the range of $10^{14}$–$10^{15}$ atoms/cm$^2$ with an energy in a range between 100 keV and 300 keV, such that a peak concentration of the dopants can be located at the prescribed distance, namely at the distance deeper than the source regions. A thermal diffusion at a temperature in the range from 1050°–1100° C. for 0.5 to 2 hours is then performed to provide the lateral diffusion of the dopant introduced with the first implant to form the lightly doped shelf portions of the body stripes extending under the gate oxide layer 16. The vertical and lateral diffusion of the dopants introduced with the second implant form the heavily doped deep body portions and the lateral lightly doped shelf portions of the P-type body stripes. Any vertical diffusion of the dopant introduced with the second implant during this thermal step does not alter the threshold voltage of the MOS-gated power device, because any dopant ions that reach the surface of the epitaxial layer have a concentration lower than the concentration of a dopant introduced with the first implant, since the peak dopant concentration of the dopant introduced with the first implant is located substantially at the surface of the epitaxial layer. Each of the above processes for forming the bowl-like body portion shape have the advantage of providing the central heavily doped body stripe that is self aligned with the edges of the elongated windows in the polysilicon layer, have one less masking step which provides for a reduced transverse dimension of the elongated window above the P-type body stripes, and thus allows an increased density of the MOS-gated power devices.

According to the embodiment of FIG. 7C, the process of manufacturing the MOS-gated power device having the body portion illustrated in FIG. 7C includes a first step of forming the central heavily doped portion of the body portion by implanting a high dose of a P-type dopant through a first mask into the epitaxial layer to form the central heavily doped portions of the P-type body stripes 9. This step of forming the central heavily doped portions of the body stripes is performed prior to opening the elongated windows in the gate oxide layer 16 and the polysilicon layer 17 (See FIG. 10) and thus can be performed at the same time as the P-type frame and the P-type elongated stripes 6, 7, and 8 are formed (See FIG. 9). Referring again to FIG. 10, the polysilicon layer 17 and the gate oxide layer 16 are then selectively etched to open the elongated windows where the P-type body stripes are to be formed. For example, a photo lithographic mask may be formed by depositing a photoresist layer over the polysilicon layer, selectively exposing the photoresist layer by the photo lithographic mask to a light source, and selectively removing the photoresist layer from regions of the polysilicon layer which are to be etched away (steps not illustrated). It is to be appreciated that the gate oxide layer may be selectively etched away at the same time as the polysilicon layer to form the elongated windows, or in the alternative the gate oxide layer can be etched at a later step after opening the source contact windows in the dielectric layer. It is apparent that the regions of the polysilicon layer that are still covered by the photoresist layer are not subject to the etching described above. The lateral lightly doped portions of the P-type body stripes are then formed by implanting through the elongated windows in the polysilicon layer a low dose of, for example, P-type dopants, to form the lateral lightly doped portions of the body stripes (step not illustrated). An advantage of the P-type body stripe shape as illustrated in FIG. 7C is that it allows the source regions in adjacent body stripes to be spaced closer together. An advantage of spacing the body stripes closer together is that the transverse dimension is reduced which yields an increased density of the MOS-gated power device.

Figure 14:
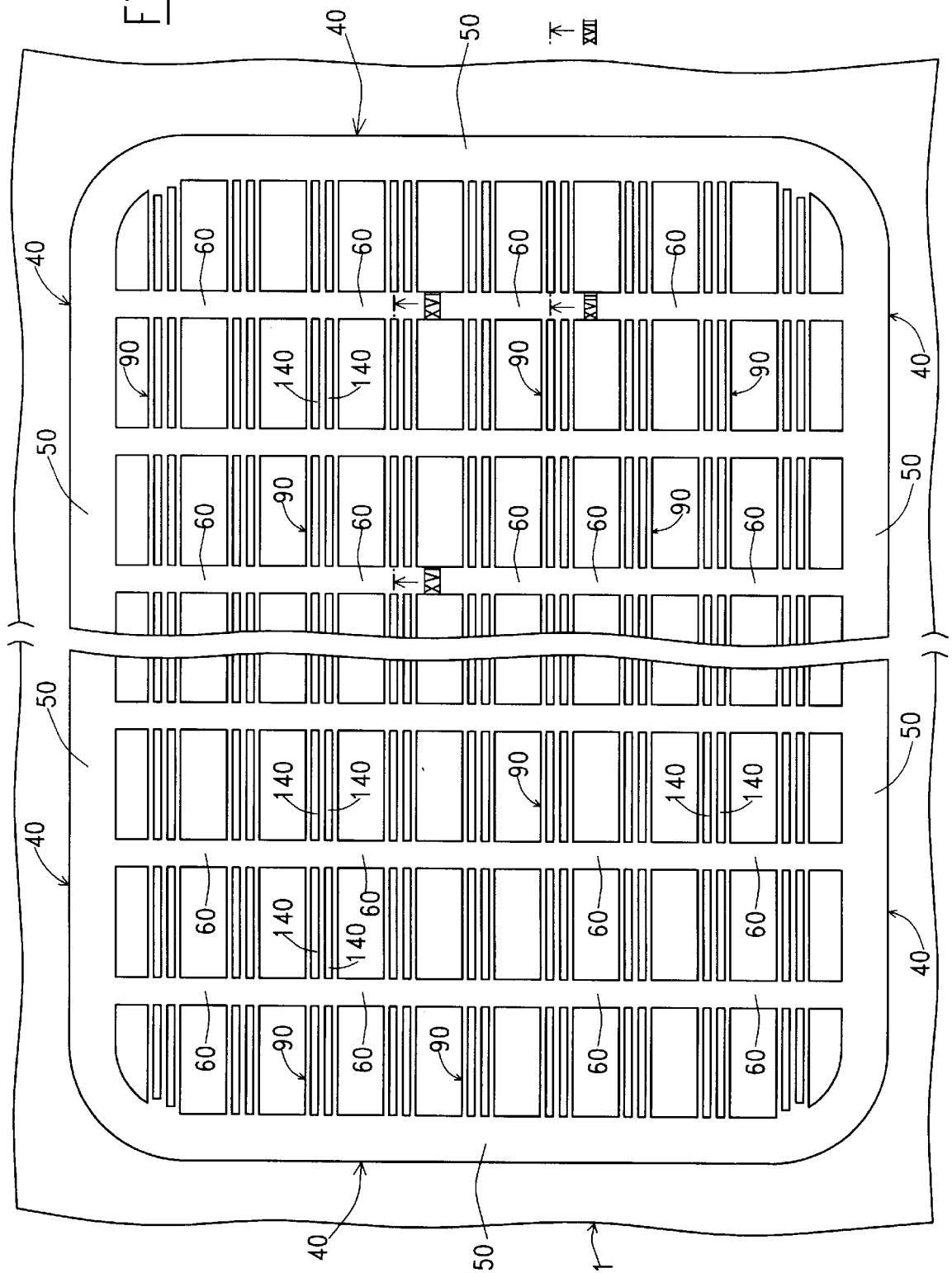
FIG. 14 is a top-plan view of a MOS-gated power device integrated structure according to a second embodiment of the present invention.

FIG. 14 is a top-plan view of a MOS-gated power device according to a second embodiment of the present invention. As discussed above with respect to the previous embodiment, the MOS-gated power device 1 comprises an N⁺ semiconductor substrate 2 and an N⁻ semiconductor epitaxial layer 3 formed over the substrate 2 (See FIGS. 15 and 16).

Referring to FIG. 14 which is a top-plan view at the top surface of the N⁻ layer 3, a P-type mesh 40 is formed in the N⁻ layer 3. The P-type mesh 40 comprises a P-type annular frame portion 50 and a plurality of substantially parallel P-type elongated stripes 60 extending between two opposite sides of the P-type annular frame portion 50. The P-type elongated stripes 60 are merged at their ends with the P-type frame 50. A plurality of P-type body stripes 90 extend substantially orthogonally to the P-type elongated stripes 60 between adjacent P-type stripes 60, between the P-type frame 50 and a first of the P-type elongated stripes 60 and between the P-type frame 50 and a last of the P-type elongated stripes. Inside each P-type body stripe 90, two elongated N⁺ source stripes 140 extend for substantially an entire longitudinal length of the body stripe 90.

Figure 15:
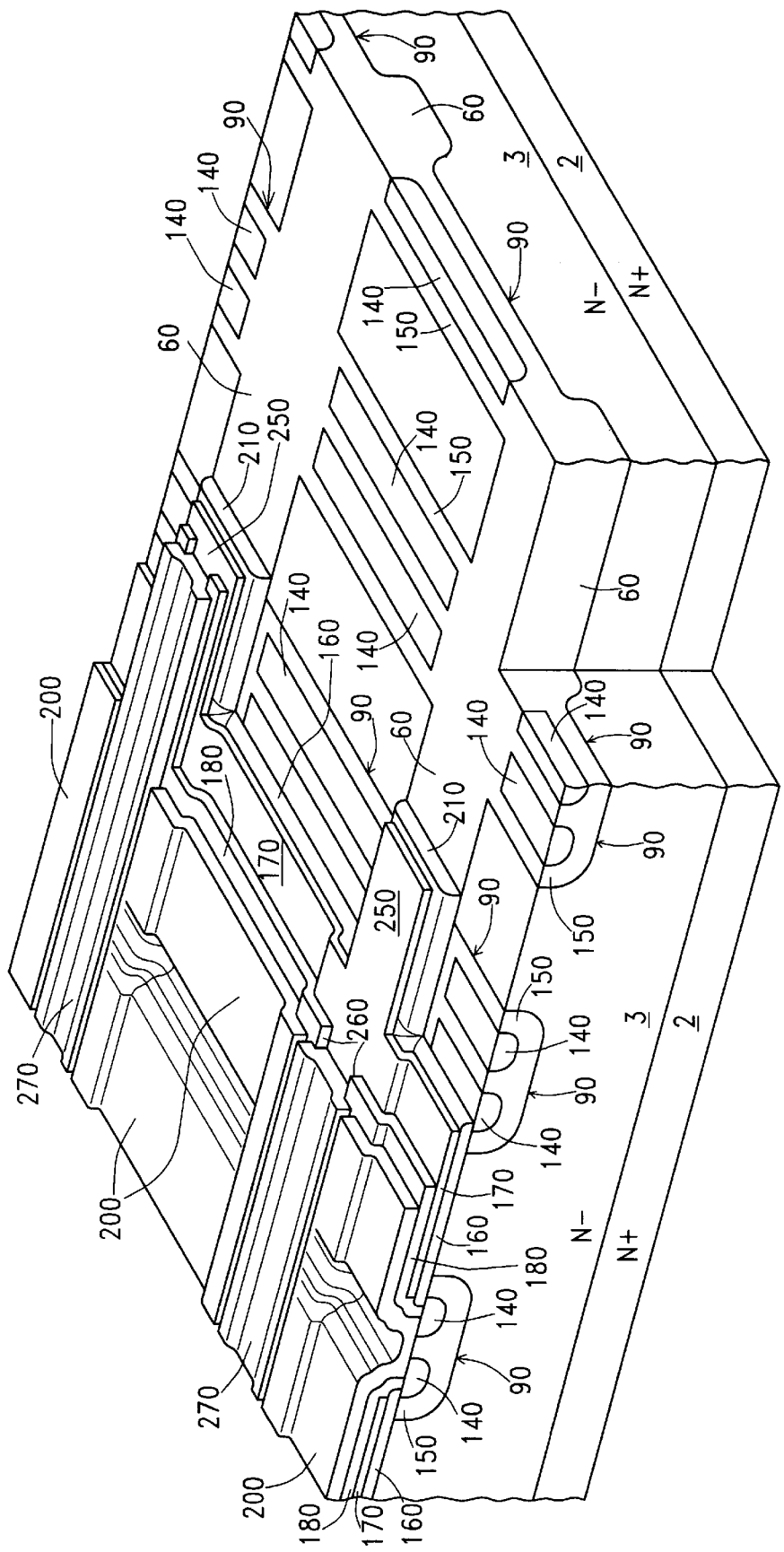
FIG. 15 is a perspective view of the MOS-gated power device integrated structure shown in FIG. 14.

Referring to FIG. 15 which is a perspective view of the second embodiment of the present invention, a conductive insulated gate layer comprising a thin gate oxide layer 160 and a polysilicon layer 170, extends over the N⁻ layer 3 between the P-type body stripes 90. The conductive insulated gate layer also extends over a lateral portion of the P-type body stripes 90. More precisely it extends over channel regions 150 defined by a lateral edge of N⁺ source stripes 140 and the lateral edge of the body stripes 90. The polysilicon layer 170 forms a gate electrode of the MOS-gated power device, and when a proper bias voltage is applied to the polysilicon layer 170 an inversion channel is formed in the channel regions 150 of the P-type body stripes 90. The polysilicon layer 170 is covered by a dielectric layer 180 in which elongated contact openings are provided over the P-type body stripes 90. The elongated contact openings in the dielectric layer 180 extend for substantially the whole length of the P-type body stripes 90. Source metal plates 200 are disposed above the dielectric layer 180 and contact, through the elongated contact openings in the dielectric layer 180, the N⁺ source regions 140 and the P-type body stripes 90. The source metal plates 200 completely cover the chip 1, except for over the P-type elongated stripes 60 where a dual-level gate metal finger 270 is disposed.

Referring now to FIGS. 15 to 17, over the P-type elongated stripes 60 there is provided a stripe 210 of a thick oxide layer (having thickness approximately equal to two-three times the thickness of the gate oxide layer 160), and extending for the whole length of the P-type stripe 60. Over the stripe 210 of the thick oxide, there is provided a stripe 250 of a polysilicon layer. The stripe 250 of polysilicon is part of the polysilicon layer 170 forming the gate electrode of the MOS-technology power device, and together the polysilicon layer 170 and the stripes 250 of polysilicon form a polysilicon metal layer web structure. The stripe 250 of the polysilicon layer is covered by a dielectric layer 180 in which an elongated contact opening 260 is provided extending for a longitudinal length and over the stripe 250. The source metal plates 200 are interrupted by each elongated contact opening 260 in the dielectric layer through which the dual-level metal gate finger 270 contacts the stripe 250 of the polysilicon layer.

Referring now to FIG. 17, there is illustrated in cross-section a region of the chip where one of the P-type body stripes 90 merges with the P-type frame 50. The P-type frame 50 is covered by a thick field oxide layer 280, over which a polysilicon gate ring 290 is provided. The polysilicon gate ring 290 is disposed over the P-type frame 50 surrounding all the P-type body stripes 90 and the P-type elongated stripes 60, and is part of the polysilicon gate layer 170. The polysilicon gate fingers 250 are connected at their ends with the polysilicon gate ring 290. Thus, the polysilicon gate ring 290, the polysilicon layer 170 and the polysilicon gate fingers 250 form the conductive gate web in the polysilicon layer overlying the P-type web 40. The dielectric layer 180 which covers the polysilicon gate layer 170, also extends over the polysilicon gate ring 290. An annular contact opening is provided in the dielectric layer 180 over the polysilicon gate ring 290, and a dual-level metal gate ring 310 contacts the underlying polysilicon gate ring 290 through the annular contact opening. The dual-level metal gate fingers 270 are merged at their ends with the dual-level metal gate ring 310 to form an additional gate metal web structure above the conductive gate web structure. A passivation layer 320 (FIGS. 16 and 17) is disposed over the entire surface of the chip to protect the chip from impurities. It is to be appreciated that although the P-type body stripes 90 and the P-type elongated body stripes 60 have been illustrated as penetrating different depths into the epitaxial layer 2, the figure is not to scale. In addition, various alterations and modifications to one of ordinary skill in the art such as, for example, the P-type body stripes 90 and the P-type elongated body stripes penetrating a same depth into the epitaxial layer are intended to be within the scope of the present invention.

It is also to be appreciated that even though the description has been directed to an N-channel power MOSFET, the present invention applies as well to P-channel power MOSFETs (which simply involves a reversing of the conductivity types) or more specifically to Insulated Gate bipolar Transistors (IGBT), in which the substrate is of the opposite conductivity type of the common drain layer 3. In particular, if the power device to be formed is a power MOSFET, the substrate 3 and the epitaxial layer 2 are of the same conductivity type, whereas if an IGBT is to be fabricated, the substrate and the epitaxial layer are of opposite conductivity types. Other MOS-gated power devices, such as, for example a MOS-gated thyristor may also require different combinations of substrates and epitaxial layers and are intended to be within the scope of this disclosure.

Having thus described several particular embodiments of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. A MOS-gated power device comprising:
   a plurality of elementary units formed in a semiconductor material layer of a first conductivity type, each elementary unit including:
      a body portion of a second conductivity type formed in the semiconductor material layer;
      at least one source region of the first conductivity type formed in each body portion; and
      a conductive gate layer disposed over the semiconductor material layer over a lateral portion of each body portion, and over a lateral edge of the at least one source region, the lateral portion of each body portion between the lateral edge of the at least one source region and a lateral edge of the body portion forming a channel region in each body portion;
   a first web structure of the second conductivity type formed in the semiconductor material layer, including a frame portion of the second conductivity type formed in the semiconductor material and surrounding the plurality of body portions, at least one first portion of the second conductivity type formed in the semiconductor material extending in a direction substantially orthogonal to the plurality of body portions and merged with the frame portion at each end of the first portion, and the plurality of body portions;
   an insulating layer disposed over the semiconductor material layer and the conductive gate layer and having windows therein to expose the plurality of body portions; and
   a source metal plate disposed over the insulating layer and contacting each of the plurality of body portions and the at least one source region within each body portion.

2. The MOS-gated power device of claim 1, further comprising:
   a window in the insulating layer above the at least one first portion;
   a first conductive gate layer insulatively disposed above the at least one first portion; and
   a metal gate layer disposed above and connected to the first conductive gate layer through the window in the insulating layer.

3. The MOS-gated power device according to claim 2, further comprising a second web structure including a conductive frame layer insulatively disposed above the frame portion, the first conductive gate layer being connected to the conductive frame layer at each end of the first conductive gate layer, and the conductive gate layer within each elementary unit being connected to the conductive frame layer and to the first conductive gate layer so as to form the second web structure.

4. The MOS-gated power device according to claim 3, further comprising a third web structure including a metal frame layer disposed above and connected to the conductive frame layer and wherein the metal gate layer is connected at each end to the metal frame layer.

5. The MOS-gated power device according to claim 4, wherein the frame portion, the conductive frame layer and the metal frame layer form an edge structure of the power device.

6. The MOS-gated power device according to claim 3, wherein the first conductive gate layer is a polysilicon material layer which is isolated from the underlying at least one first portion by a first oxide layer.

7. The MOS-gated power device according to claim 6, wherein the metal gate layer is disposed above the insulating layer along its lateral edges, and wherein the insulating layer is disposed above the first conductive gate layer and above the first oxide layer, to provide a dual-level metal gate layer.

8. The MOS-gated power device according to claim 6, wherein the first web structure further includes at least one second portion of the second conductivity type formed in the semiconductor material in the direction substantially orthogonal to the plurality of body portions and merged with the frame portion at each end of the second portion, and wherein the second web structure further includes a second conductive gate layer insulatively disposed above the at least one second portion, the second conductive gate layer being connected along a lateral edge to the conductive gate layer in each elementary unit and being connected at each end of the second conductive gate layer to the conductive frame layer.

9. The MOS-gated power device according to claim 8, wherein the at least one second portion includes a plurality of said second portions disposed in parallel in the direction substantially orthogonal to the plurality of body portions.

10. The MOS-gated power device according to claim 8, wherein the second conductive gate layer is a polysilicon material which is insulated from the underlying at least one second portion by a second oxide layer having substantially a same thickness as the first oxide layer.

11. The MOS-gated power device according to claim 1, wherein the at least one source region includes two source regions disposed in parallel in each body portion.

12. The MOS-gated power device according to claim 1, wherein the at least one source region includes a plurality of source regions intercalated along a length of each body portion with portions of each body portion.

13. The MOS-gated power device according to claim 1, wherein the semiconductor material layer is superimposed over a highly doped semiconductor material substrate.

14. The MOS-gated power device according to claim 13, wherein the highly doped semiconductor material substrate is of the first conductivity type.

15. The MOS-gated power device according to claim 13, wherein the highly doped semiconductor material substrate is of the second conductivity type.

16. The MOS-gated power device according to claim 1, wherein the first conductivity type is N-type and the second conductivity type is P-type.

17. The MOS-gated power device according to claim 1, wherein the first conductivity type is P-type and the second conductivity type is N-type.

18. The MOS-gated power device according to claim 1, wherein the conductive gate layer in each elementary unit is disposed above an oxide layer, and wherein the oxide layer is disposed above the semiconductor material layer between the plurality of body portions and above the channel region within each body portion.

19. The MOS-gated power device according to claim 6, wherein the conductive gate layer in each elementary unit is disposed above a second oxide layer, and wherein the second oxide layer is disposed above the semiconductor material layer between the plurality of body portions and above the channel region within each body portion.

20. The MOS-gated power device of claim 19, where the first oxide layer has a thickness in a range of two to three times a thickness of the second oxide layer.

21. The MOS-gated power device of claim 19, wherein the first oxide layer and the second outside layer have a substantially uniform thickness.

22. The MOS-gated power device according to claim 1, wherein the conductive gate layer within each elementary functional unit includes a first conductive gate region and a second conductive gate region disposed substantially in parallel over the semiconductor material layer between the plurality of body portions.

23. The MOS-gated power device according to claim 4, wherein the first web structure, the second web structure, and the third web structure are electrically connected to a gate contact pad disposed above the insulating layer of the MOS-gated power device, the gate contact pad being physically connected to the third web structure at an edge of the metal frame layer and having a thickness sufficient for bonding to the gate contact pad.

24. The MOS-gated power device according to claim 1, wherein the source metal plate forms a source bond pad of the MOS-gated power device and has a thickness sufficient for bonding to the source metal plate.

25. The MOS-gated power device according to claim 1, further comprising a plurality of second body portions of the second conductivity type formed in the semiconductor material layer substantially in parallel with and between the plurality of body portions, each second body portion being disposed beneath a respective conductive gate layer.

26. The MOS-gated power device according to claim 25, further comprising a plurality of regions of the first conductivity type formed in the semiconductor material layer, each region of the first conductivity type being formed between a respective body portion and a respective second body portion.

27. The MOS-gated power device according to claim 1, wherein each body portion includes a central heavily doped deep body portion and two lateral lightly doped channel regions, the central heavily doped deep body portion having edges substantially aligned with edges of the conductive gate layer.

28. The MOS-gated power device according to claim 1, wherein each body portion has a bowl-like shape.

29. A power MOSFET comprising:
a semiconductor material layer of a first conductivity type that is lightly doped with dopants of the first conductivity type;
a first web structure of a second conductivity type formed in a first surface of the semiconductor material layer, the first web structure including the plurality of body portions of the second conductivity type formed in the semiconductor material layer, at least one first portion of the second conductivity type formed in the semiconductor material layer extending in a direction substantially orthogonal to the plurality of body portions, and a frame portion of the second conductivity type formed in the semiconductor material layer and surrounding the plurality of body portions and the at least one first portion, the at least one first portion being merged with the frame portion at each end of the at least one first portion, some of the plurality of body portions having an end that is merged with the frame portion and some of the plurality of body portions having an end that is merged with the at least one first portion.

30. The power MOSFET as claimed in claim 29, further comprising at least one source region of the first conductivity type disposed within each body portion, the at least one source region extending into a first surface of each body portion and having a depth less than a depth of the respective body portion, the at least one source region having a lateral edge that is interior to and spaced by a fixed distance from a lateral edge of the respective body portion thereby forming a channel region in the respective body portion.

31. The power MOSFET as claimed in claim 30, further comprising a second web structure formed in a conductive gate layer disposed above the first surface of semiconductor material layer, the conductive gate layer having first conductive gate regions, each first conductive gate region being disposed over the first surface of the semiconductor material layer between adjacent pairs of the body portions, each first conductive gate region extending over the channel region within each of the adjacent pairs of body portions, the second web structure further comprising a conductive gate region insulatively disposed above the at least one first portion and a conductive frame region insulatively disposed above the frame portion, the conductive gate region being merged at a first end and at a second end with the conductive frame region, some of the first conductive gate regions being merged at an end with the conductive frame region and some of the first conductive gate regions being merged at an end with the conductive gate region to form the second web structure.

32. The power MOSFET as claimed in claim 31, further comprising a third web structure formed in a metal gate layer disposed above the conductive gate layer, the third web structure including a metal gate region disposed above and physically connected to the conductive gate region and a metal frame region disposed above and physically connected to the conductive frame region, the metal gate region being merged with the metal frame region at each end of the metal gate region.

33. The power MOSFET as claimed in claim 32, further comprising:

an insulating layer disposed over the first surface of the semiconductor material layer so as to cover the metal gate layer and the conductive gate layer, having windows therein to expose the plurality of body portions and having a window therein above the at least one first portion; and a source metal layer disposed above the insulating layer and physically connected to the at least one source region and each body portion through the windows, the source metal layer including a first source plate extending over the first surface of the semiconductor material layer and contacting some of the plurality of body portions and a second source plate extending over the first surface of the semiconductor material layer and contacting some of the plurality of body portions.

34. The power MOSFET as claimed in claim 32, wherein the conductive gate region is insulated from the at least one first portion by a first oxide layer.

35. The power MOSFET as claimed in claim 34, wherein the metal gate region is insulated from the conductive gate region along its lateral edges by a second oxide layer disposed above lateral edges of the conductive gate region and disposed above the first oxide layer, the second oxide layer having a window formed therein, and the metal gate region physically contacting the conductive gate region through the window in the second oxide layer such that a dual-level metal gate region is provided.

36. The power MOSFET according to claim 33, wherein the first web structure further includes at least one second portion of the second conductivity type formed in the semiconductor material layer in the direction substantially orthogonal to the plurality of body portions, the at least one second portion being merged with the frame region at each end of the second portion, and wherein the second web structure further includes a second conductive gate region insulatively disposed above the at least one second portion, the second conductive gate region being connected to the first conductive gate region disposed over each body portion along a lateral edge of the second conductive gate region, and the second conductive gate region being connected at each end to the conductive frame region.

37. The power MOSFET as claimed in claim 30, wherein the at least one source region includes two source regions disposed in parallel in each body portion.

38. The power MOSFET as claimed in claim 30, wherein the at least one source region includes a plurality of source regions intercalated along a length of each body portion with portions of each body portion.

39. The power MOSFET according to claim 29, wherein the semiconductor material layer is disposed over a highly doped semiconductor material substrate and wherein a drain electrode is physically connected to a surface of the highly doped semiconductor material substrate.

40. The power MOSFET as claimed in claim 31, wherein each first conductive gate region includes a first gate region and a second gate region disposed substantially in parallel over the first surface of the semiconductor material layer between each adjacent pair of body portions.

41. The power MOSFET as claimed in claim 31, further comprising a plurality of second body portions of the second conductivity type, each second body portion being disposed in the first surface of the semiconductor material layer in parallel with and between adjacent pairs of body portions and being disposed beneath a respective first conductive gate region.

42. The power MOSFET as claimed in claim 41, further comprising a region of the first conductivity type formed in the first surface of the semiconductor material layer between each body portion and each second body portion.

43. The power MOSFET as claimed in claim 31, wherein the conductive gate layer is a polysilicon material layer, wherein each first conductive gate region is disposed above a first oxide layer that is disposed above the semiconductor material layer between the plurality of body portions and that is disposed above the channel region within each body portion, and wherein the conductive gate region is disposed above a second oxide layer that is disposed above the at least one first portion.

44. The power MOSFET according claim 43, wherein the second oxide layer has a thickness in the range of 2 to 3 times a thickness of the first oxide layer.

45. The power MOSFET according to claim 43, wherein the first oxide layer and the second oxide layer have a substantially uniform thickness.

46. The power MOSFET according to claim 29, wherein each body portion includes a central heavily doped deep body portion and two lateral lightly doped channel regions.

47. The power MOSFET according to claim 29, wherein each body portion has a bowl-like shape.

* * * * *

UNITED STATES PATENT AND TRADEMARK OFFICE
CERTIFICATE OF CORRECTION

PATENT NO. : 5,841,167 Page 1 of 1
DATED : November 24, 1998
INVENTOR(S) : Grimaldi et al.

It is certified that error appears in the above-identified patent and that said Letters Patent is hereby corrected as shown below:

Column 18,
Line 23, should read -- the first web structure including a plurality of body --.

Signed and Sealed this

Twenty-second Day of November, 2005

JON W. DUDAS
*Director of the United States Patent and Trademark Office*